US012133386B2

(12) United States Patent
Wang et al.

(10) Patent No.: US 12,133,386 B2
(45) Date of Patent: Oct. 29, 2024

(54) CONTACT PADS OF THREE-DIMENSIONAL MEMORY DEVICE AND FABRICATION METHOD THEREOF

(71) Applicant: Yangtze Memory Technologies Co., Ltd., Wuhan (CN)

(72) Inventors: Yongqing Wang, Wuhan (CN); Siping Hu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 797 days.

(21) Appl. No.: 17/249,247

(22) Filed: Feb. 24, 2021

(65) Prior Publication Data
US 2022/0181350 A1 Jun. 9, 2022

Related U.S. Application Data

(63) Continuation of application No. PCT/CN2020/134857, filed on Dec. 9, 2020.

(51) Int. Cl.
*H10B 43/27* (2023.01)
*H01L 23/00* (2006.01)
(Continued)

(52) U.S. Cl.
CPC ............ *H10B 43/27* (2023.02); *H01L 24/03* (2013.01); *H01L 24/08* (2013.01); *H10B 41/10* (2023.02);
(Continued)

(58) Field of Classification Search
CPC ........ H10B 43/27; H10B 41/27; H10B 41/10; H10B 43/10; H10B 43/35; H10B 41/35;
(Continued)

(56) References Cited

U.S. PATENT DOCUMENTS

2018/0331118 A1* 11/2018 Amano ............ H01L 21/76856
2018/0342455 A1* 11/2018 Nosho ................... H10B 41/27
(Continued)

FOREIGN PATENT DOCUMENTS

| CN | 109155320 A | 1/2019 |
| CN | 110574162 A | 12/2019 |

(Continued)

OTHER PUBLICATIONS

The World Intellectual Property Organization (WIPO) International Search Report for PCT/CN2020/134857 Sep. 10, 2021 5 pages.

*Primary Examiner* — William B Partridge
*Assistant Examiner* — David Paul Sedorook
(74) *Attorney, Agent, or Firm* — Anova Law Group, PLLC

(57) ABSTRACT

Three-dimensional (3D) NAND memory devices and methods are provided. In one aspect, a fabrication method for a 3D NAND memory device includes providing a substrate, forming at least one contact pad over a first portion of a face side of the substrate, forming memory cells over a second portion of the face side of the substrate, depositing a first dielectric layer to cover the at least one contact pad and the memory cells of, forming a first connecting pads over the first dielectric layer and connected to the at least one contact pad and the memory cells, bonding the first connecting pads with second connecting pads of a peripheral structure, and exposing the at least one contact pad from a back side of the substrate.

19 Claims, 19 Drawing Sheets

(51) Int. Cl.
*H10B 41/10* (2023.01)
*H10B 41/27* (2023.01)
*H10B 41/35* (2023.01)
*H10B 43/10* (2023.01)
*H10B 43/35* (2023.01)

(52) U.S. Cl.
CPC ............ *H10B 41/27* (2023.02); *H10B 41/35* (2023.02); *H10B 43/10* (2023.02); *H10B 43/35* (2023.02)

(58) Field of Classification Search
CPC ......... H01L 27/11582; H01L 27/11586; H01L 27/11519; H01L 27/11565; H01L 27/1157; H01L 27/11524; H01L 24/08; H01L 24/03
See application file for complete search history.

(56) References Cited

U.S. PATENT DOCUMENTS

| | | | |
|---|---|---|---|
| 2019/0057756 A1* | 2/2019 | Kim | H10B 41/27 |
| 2019/0333929 A1* | 10/2019 | Lee | H10B 41/20 |
| 2020/0203364 A1 | 6/2020 | Totoki et al. | |
| 2020/0251149 A1* | 8/2020 | Zhang | H01L 25/0657 |
| 2020/0357784 A1 | 11/2020 | Park et al. | |
| 2020/0365560 A1 | 11/2020 | Kanamori et al. | |

FOREIGN PATENT DOCUMENTS

| | | |
|---|---|---|
| CN | 111937148 A | 11/2020 |
| CN | 111971795 A | 11/2020 |
| KR | 20160069903 | 6/2016 |
| TW | I710118 B | 11/2020 |
| WO | 2020034152 A1 | 2/2020 |

* cited by examiner

CONTACT PADS OF THREE-DIMENSIONAL MEMORY DEVICE AND FABRICATION METHOD THEREOF

CROSS-REFERENCE TO RELATED APPLICATION

This application claims the priority to PCT Patent Application No. PCT/CN2020/134857 filed on Dec. 9, 2020, the entire content of which is incorporated herein by reference.

FIELD OF THE TECHNOLOGY

This application relates to the field of semiconductor technology and, specifically, to a three-dimensional (3D) memory device and fabrication method thereof.

BACKGROUND OF THE DISCLOSURE

Not-AND (NAND) memory is a non-volatile type of memory that does not require power to retain stored data. The growing demands of consumer electronics, cloud computing, and big data bring about a constant need of NAND memories of larger capacity and better performance. As conventional two-dimensional (2D) NAND memory approaches its physical limits, three-dimensional (3D) NAND memory is now playing an important role. 3D NAND memory uses multiple stack layers on a single die to achieve higher density, higher capacity, faster performance, lower power consumption, and better cost efficiency.

When contact pads of a 3D NAND structure are fabricated, a metal layer is deposited and plasma processing is often used during the process. Plasma processing can generate plasma-induced damage (PID) to complementary-metal-oxide-semiconductor (CMOS) circuits. For example, an unintended high electric field can develop stresses and degrade the gate-oxide in a metal-oxide-silicon (MOS) transistor during plasma processing. In addition, the insulator of a metal-insulator-metal (MIM) capacitor can also be degraded or damaged. The disclosed devices and methods are directed to solve one or more problems set forth above and other problems.

SUMMARY

In one aspect of the present disclosure, a fabrication method for a 3D memory device includes providing a substrate for the 3D memory device, forming at least one contact pad over a first portion of a face side of the substrate, forming memory cells of the 3D memory device over a second portion of the face side of the substrate, depositing a first dielectric layer to cover the at least one contact pad and the memory cells of the 3D memory device, forming a first connecting pads over the first dielectric layer and connected to the at least one contact pad and the memory cells of the 3D memory device, bonding the first connecting pads with second connecting pads of a peripheral structure, and exposing the at least one contact pad from a back side of the substrate.

In another aspect of the present disclosure, a 3D memory device includes an array device, a peripheral device, and an opening. The array device and peripheral device are bonded face to face. The array device includes an insulating layer, one or more contact pads, and memory cells. The opening is formed through a first portion of the insulating layer and exposes the one or more contact pads disposed at a bottom of the opening from a back side of the array device. The memory cells are disposed between a second portion of the insulating layer and the peripheral device.

Other aspects of the present disclosure can be understood by those skilled in the art in light of the description, the claims, and the drawings of the present disclosure.

DETAILED DESCRIPTION

The following describes the technical solutions in the embodiments of the present disclosure with reference to the accompanying drawings. Wherever possible, the same reference numbers will be used throughout the drawings to refer to the same or like parts. Apparently, the described embodiments are merely some but not all of the embodiments of the present disclosure. Features in various embodiments may be exchanged and/or combined. Other embodiments obtained by a person skilled in the art based on the embodiments of the present disclosure without creative efforts shall fall within the scope of the present disclosure.

FIGS. 1-11 schematically show fabrication processes of an exemplary 3D array device 100 according to embodiments of the present disclosure. The 3D array device 100 is a part of a memory device and may also be referred to as a 3D memory structure. Among the figures, top views are in an X-Y plane and cross-sectional views are in a Y-Z plane.

Figure 1:
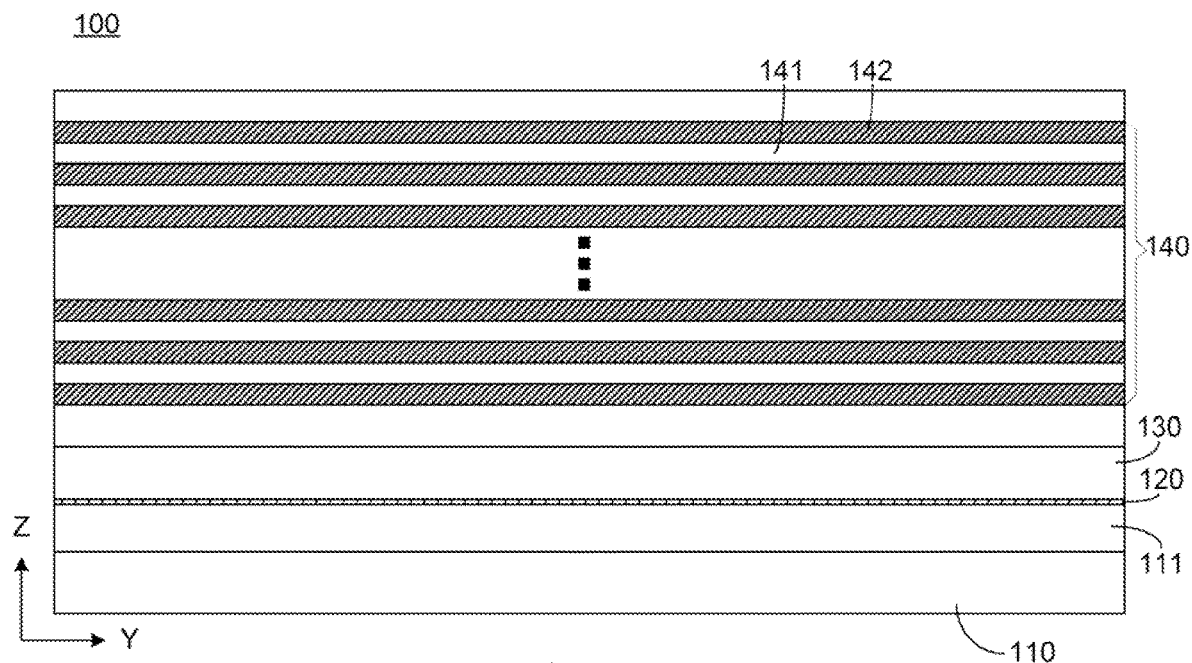
FIGS. 1 and 2 illustrate cross-sectional views of an exemplary three-dimensional (3D) array device at certain stages during a fabrication process according to various embodiments of the present disclosure.

As shown in a cross-sectional view in FIG. 1, the 3D array device 100 may include a substrate 110. In some embodiments, the substrate 110 may include a single crystalline silicon layer. The substrate 110 may also include a semiconductor material, such as germanium (Ge), silicon-germanium (SiGe), silicon carbide (SiC), silicon-on-insulator (SOI), germanium-on-insulator (GOI), polycrystalline silicon (polysilicon), or a Group III-V compound such as gallium arsenide (GaAs) or indium phosphide (InP). The substrate 110 may also include an electrically non-conductive material such as glass, a plastic material, or a ceramic material. When the substrate 110 includes glass, plastic, or ceramic material, the substrate 110 may further include a thin layer of polysilicon deposited on the glass, plastic, or ceramic material. In this case, the substrate 110 may be processed like a polysilicon substrate. As an example, the substrate 110 includes an undoped or lightly doped single crystalline silicon layer in descriptions below.

In some embodiments, a top portion of the substrate 110 may be doped by n-type dopants via ion implantation and/or diffusion to become a doped region 111. Optionally, an n-doped layer may be grown over the substrate 110 to form the doped region 111. In descriptions below, as an example, the doped region 111 is formed by doping a top portion of the substrate 110. The dopants of the doped region 111 may include, for example, phosphorus (P), arsenic (As), and/or antimony (Sb). As shown in FIG. 1, a cover layer 120 may be deposited over the doped region 111. The cover layer 120 is a sacrificial layer and may include a single layer or a multilayer. For example, the cover layer 120 may include one or more of silicon oxide layer and silicon nitride layer. The cover layer 120 may be deposited by chemical vapor deposition (CVD), physical vapor deposition (PVD), atomic layer deposition (ALD), or a combination thereof. In some other embodiments, the cover layer 120 may include another material such as aluminum oxide.

Further, over the cover layer 120, a sacrificial layer 130 may be deposited. The sacrificial layer 130 may include a dielectric material, a semiconductor material, or a conductive material. An exemplary material for the sacrificial layer 130 is polysilicon.

After the polysilicon sacrificial layer 130 is formed, a layer stack 140 may be formed. The layer stack 140 includes multiple pairs of stack layers, for example, including first dielectric layers 141 and second dielectric layers 142, stacked alternately over each other. The layer stack may include 64 pairs, 128 pairs, or more than 128 pairs of the first and second dielectric layers 141 and 142.

In some embodiments, the first dielectric layers 141 and the second dielectric layers 142 may be made of different materials. For example, the different materials may include silicon oxide and silicon nitride. In descriptions below, the first dielectric layer 141 may include a silicon oxide layer exemplarily, which may be used as an isolation stack layer, while the second dielectric layer 142 may include a silicon nitride layer exemplarily, which may be used as a sacrificial stack layer. The sacrificial stack layer may be subsequently etched out and replaced by a conductor layer. The first dielectric layers 141 and the second dielectric layers 142 may be deposited via CVD, PVD, ALD, or a combination thereof.

Figure 2:
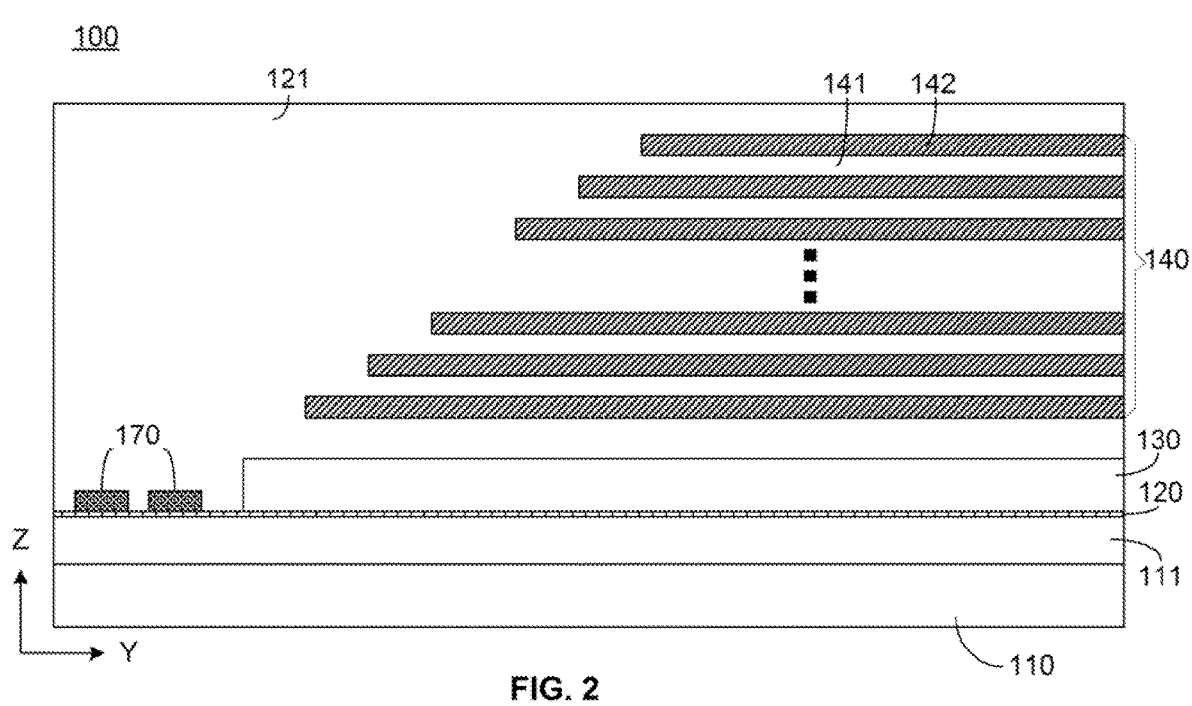

FIG. 2 shows a schematic cross-sectional view of the 3D array device 100 according to embodiments of the present disclosure. As shown in FIG. 2, after the layer stack 140 is formed, a staircase formation process may be performed to trim a part of the layer stack 140 into a staircase structure. Any suitable etching processes, including dry etch and/or wet etch processes, may be used in the staircase formation process. For example, the height of the staircase structure may increase in a stepwise manner along the Y direction.

Further, metal layers 170 may be formed over the top surface of the substrate on a side of the staircase structure. The metal layers 170 may also be referred as conductor layers 170. Optionally, the metal layers 170 may be formed on the cover layer 120 beside the staircase structure. In some embodiments, a single metal layer (not shown), instead of multiple metal layers (e.g., the metal layers 170), may be made over the top surface of the substrate. The metal layers 170 may be deposited by CVD, PVD, ALD, electroplating, electroless plating, or any combination thereof. A dielectric layer 121 may be deposited to cover the metal layers 170 and the staircase structure. The metal layers 170 may be buried in the dielectric layer 121 that extends from the cover layer 120 to a top surface of the 3D array device 100. The metal layers 170 may be exposed subsequently from the bottom surface of the substrate to become contact pads of the 3D array device 100.

The metal layers 170 may be formed before or after the layer stack 140 is fabricated. In the former scenario, several methods may be used to make the metal layers 170. In the first method, the cover layer 120 may be formed over the substrate 110, the metal layers 170 may be deposited over the cover layer 120, and then a top portion of the substrate 110 may be doped by n-type dopants via ion implantation and/or diffusion to become the doped region 111. Next, the sacrificial layer 130 and the layer stack 140 may be formed over the doped region 111. In the second method, the doped region 111 may be created by ion implantation and/or diffusion, the cover layer 120 may be formed over the doped region 111, and then the metal layers 170 may be deposited over the cover layer 120, followed by forming the sacrificial layer 130 and the layer stack 140 over the doped region 111. In the third method, the doped region 111 may be created by ion implantation and/or diffusion, the cover layer 120 may be formed over the doped region 111, and then the sacrificial layer 130 may be deposited over the cover layer 120. Next, a part of the sacrificial layer 130 may be etched away to expose the cover layer 120, and the metal layers 170 may be deposited over the exposed cover layer 120. The opening left by exposing the cover layer 120 may be filled by a dielectric material such as silicon oxide. Thereafter, the layer stack 140 may be formed over the sacrificial layer 130. In the fourth method, a dielectric or insulating layer may be formed over a part of the substrate 110 and the metal layers 170 may be deposited over the insulating layer. The doped region 111 may be created by ion implantation and/or diffusion in another part of the substrate 100. The cover layer 120 may be deposited over the doped region 111, and then the sacrificial layer 130 and the layer stack 140 may be formed over the cover layer 120. In above four methods, the metal layers 170 may be buried under a portion of the layer stack 140, i.e., covered by the alternating first and second dielectric layers 141 and 142 after the formation of the layer stack 140. During the staircase formation process, the portion of the layer stack 140 that is above the metal layers 170 may be removed and the metal layers 170 may become exposed. When the dielectric layer 121 is deposited to cover the staircase structure, the metal layers 170 may be covered by the dielectric layer 121 at the same time, which is shown in FIG. 2.

When the metal layers 170 are formed after the layer stack 140 is fabricated, the metal layers 170 may be formed before, after, or within a time period during which the staircase structure is made. Since the metal layers 170 and the staircase structure are spaced apart by a certain distance horizontally and do not share a common component, they may be formed separately in various process sequences. That is, the metal layers 170 may be formed before, after, or during the staircase formation process. When the metal layers 170 are formed before the staircase formation process, a portion of the layer stack 140 and a portion of the sacrificial layer 130 may be etched away to expose the cover layer 120. Then the metal layers 170 may be deposited over the exposed cover layer 120. The opening left by exposing the cover layer 120 may be filled by a dielectric material such as silicon oxide. Thereafter, the staircase formation process may begin. When the metal layers 170 are formed after the staircase formation process, a portion of the dielectric layer 121 may be etched away to expose the cover layer 120, and then the metal layers 170 may be deposited over the exposed cover layer 120. The opening left by exposing the cover layer 120 may be filled by a dielectric material such as silicon oxide.

When the metal layers 170 are formed during the staircase formation process, the metal layers 170 may be deposited after the staircase structure is created but before the staircase structure is covered by the dielectric layer 121. For example, after certain portions of the stack layers are etched to form the staircase structure, a portion of the sacrificial layer 130 may be exposed. The exposed portion of the sacrificial layer 130 may be etched, and the cover layer 120 may be exposed. The metal layers 170 may be deposited over the exposed cover layer 120. Thereafter, the dielectric layer 121 may be deposited to cover the metal layers 170 and the staircase structure at the same time, which is shown in FIG. 2.

Hence the metal layers 170 may be formed before or after the formation of the layer stack 140, and be disposed over the cover layer 120, buried by the dielectric layer 121, and beside the staircase structure in all scenarios and cases illustrated above, which is shown in FIG. 2. Thus, any of the methods described above may be used to create the metal layers 170, which does not affect descriptions below with regard to embodiments of the present disclosure.

Figure 3:
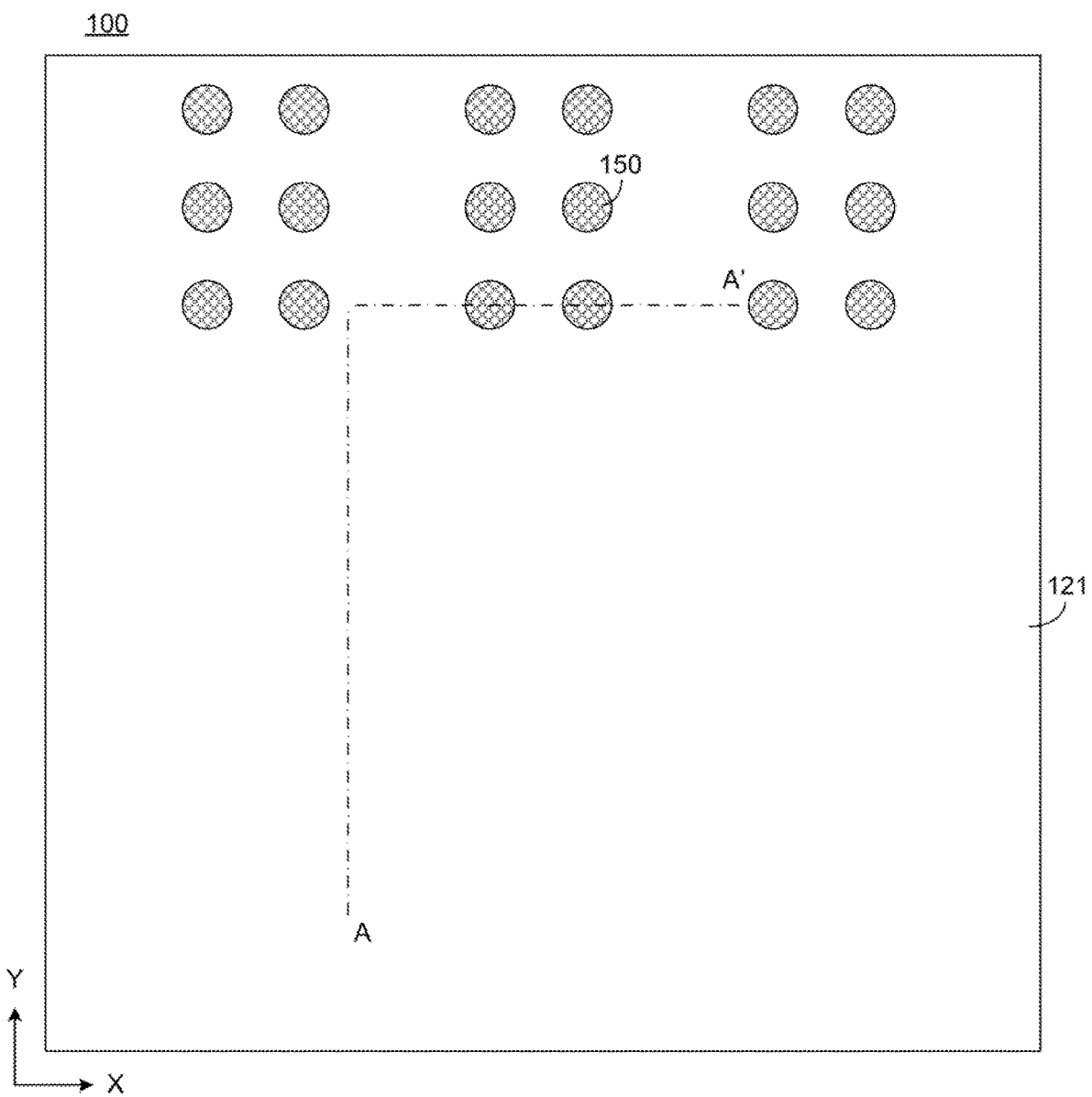
FIGS. 3 and 4 illustrate a top view and a cross-sectional view of the 3D array device shown in FIG. 2 after channel holes are formed according to various embodiments of the present disclosure.
Figure 4:
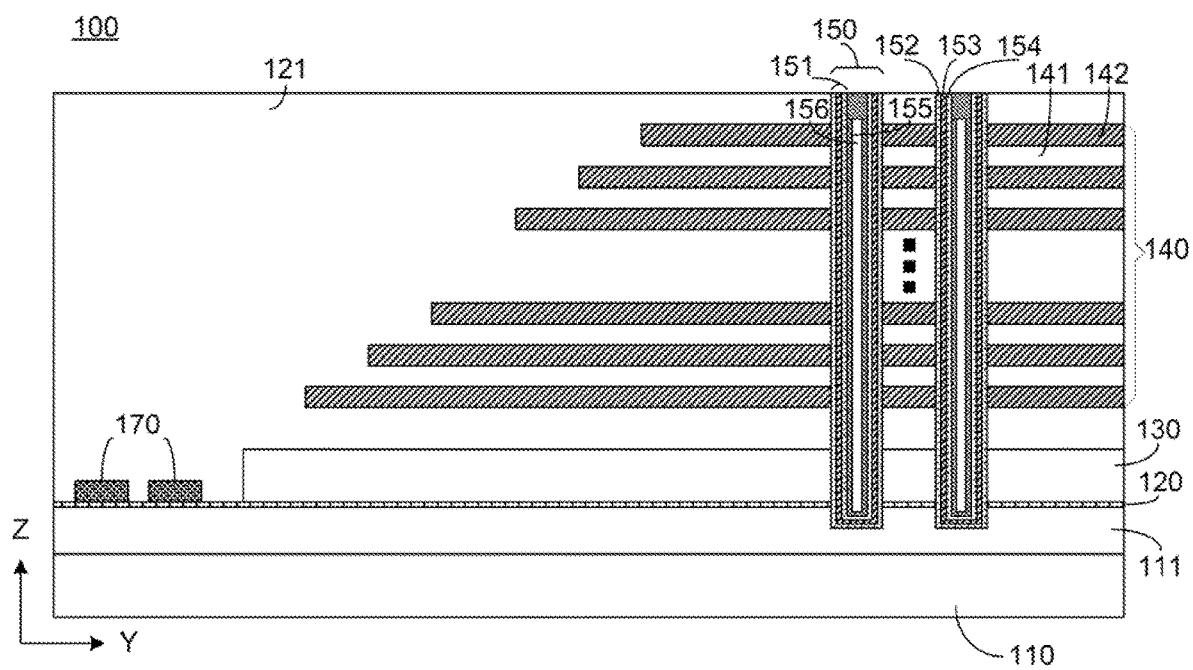

FIGS. 3 and 4 show a schematic top view and a schematic cross-sectional view of the 3D array device 100 after channel holes 150 are formed and then filled with layer structures according to embodiments of the present disclosure. The cross-sectional view shown in FIG. 4 is taken along a line AA' of FIG. 3. The quantity, dimension, and arrangement of the channel holes 150 shown in FIGS. 3 and 4 and in other figures in the present disclosure are exemplary and for description purposes, although any suitable quantity, dimension, and arrangement may be used for the disclosed 3D array device 100 according to various embodiments of the present disclosure.

As shown in FIGS. 3 and 4, the channel holes 150 are configured to extend in the Z direction or in a direction approximately perpendicular to the substrate 110 and form an array of a predetermined pattern (not shown) in the X-Y plane. The channel holes 150 may be formed by, for example, a dry etch process or a combination of dry and wet etch processes. Other fabrication processes may also be performed, such as a patterning process involving lithography, cleaning, and/or chemical mechanical polishing (CMP). The channel holes 150 may have a cylinder shape or pillar shape that extends through the layer stack 140, the sacrificial layer 130, the cover layer 120, and partially penetrates the doped region 111. After the channel holes 150 are formed, a functional layer 151 may be deposited on the sidewall and bottom of the channel hole. The functional layer 151 may include a blocking layer 152 on the sidewall and bottom of the channel hole to block an outflow of charges, a charge trap layer 153 on a surface of the blocking layer 152 to store charges during an operation of the 3D array device 100, and a tunnel insulation layer 154 on a surface of the charge trap layer 153. The blocking layer 152 may include one or more layers that may include one or more materials. The material for the blocking layer 152 may include silicon oxide, silicon nitride, silicon oxynitride, a high-k dielectric material such as aluminum oxide or hafnium oxide, or another wide bandgap material. The charge trap layer 153 may include one or more layers that may include one or more materials. The materials for the charge trap layer 153 may include polysilicon, silicon nitride, silicon oxynitride, nanocrystalline silicon, or another wide bandgap material. The tunnel insulation layer 154 may include one or more layers that may include one or more materials. The material for the tunnel insulation layer 154 may include silicon oxide, silicon nitride, silicon oxynitride, a high-k dielectric material such as aluminum oxide or hafnium oxide, or another wide bandgap material.

In some embodiments, the functional layer 151 may include an oxide-nitride-oxide (ONO) structure. In some other embodiments, however, the functional layer 151 may have a structure different from the ONO configuration. When the ONO structure is used exemplarily in descriptions below, the functional layer 151 may include a silicon oxide layer, a silicon nitride layer, and another silicon oxide layer. That is, the blocking layer 152 may be a silicon oxide layer deposited on the sidewall of the channel hole 150, the charge trap layer 153 may be a silicon nitride layer deposited on the blocking layer 152, and the tunnel insulation layer 154 may be another silicon oxide layer deposited on the charge trap layer 153.

Further, a channel layer 155 may be deposited on the tunnel insulation layer 154. The channel layer 155 is also referred to as a "semiconductor channel" and may include polysilicon in some embodiments. Alternatively, the channel layer 155 may include amorphous silicon. Like the channel holes, the channel layer 155 also extends through the layer stack 140 and into the doped region 111. The blocking layer 152, the charge trap layer 153, the tunnel insulation layer 154, and the channel layer 155 may be deposited by, e.g., CVD, PVD, ALD, or a combination of two or more of these processes. The channel hole 150 may be filled by an oxide material 156 after the channel layer 155 is formed.

In the process described above, the channel holes 150 are etched after the staircase structure is formed. The channel holes 150 may also be formed before the staircase formation process. For example, after the layer stack 140 is fabricated as shown in FIG. 1, the channel holes 150 may be formed and then the functional layer 151 and the channel layer 155 may be deposited. After the channel holes 150 are filled with the oxide material 156, the staircase formation process may be performed to form the staircase structure.

Figure 5:
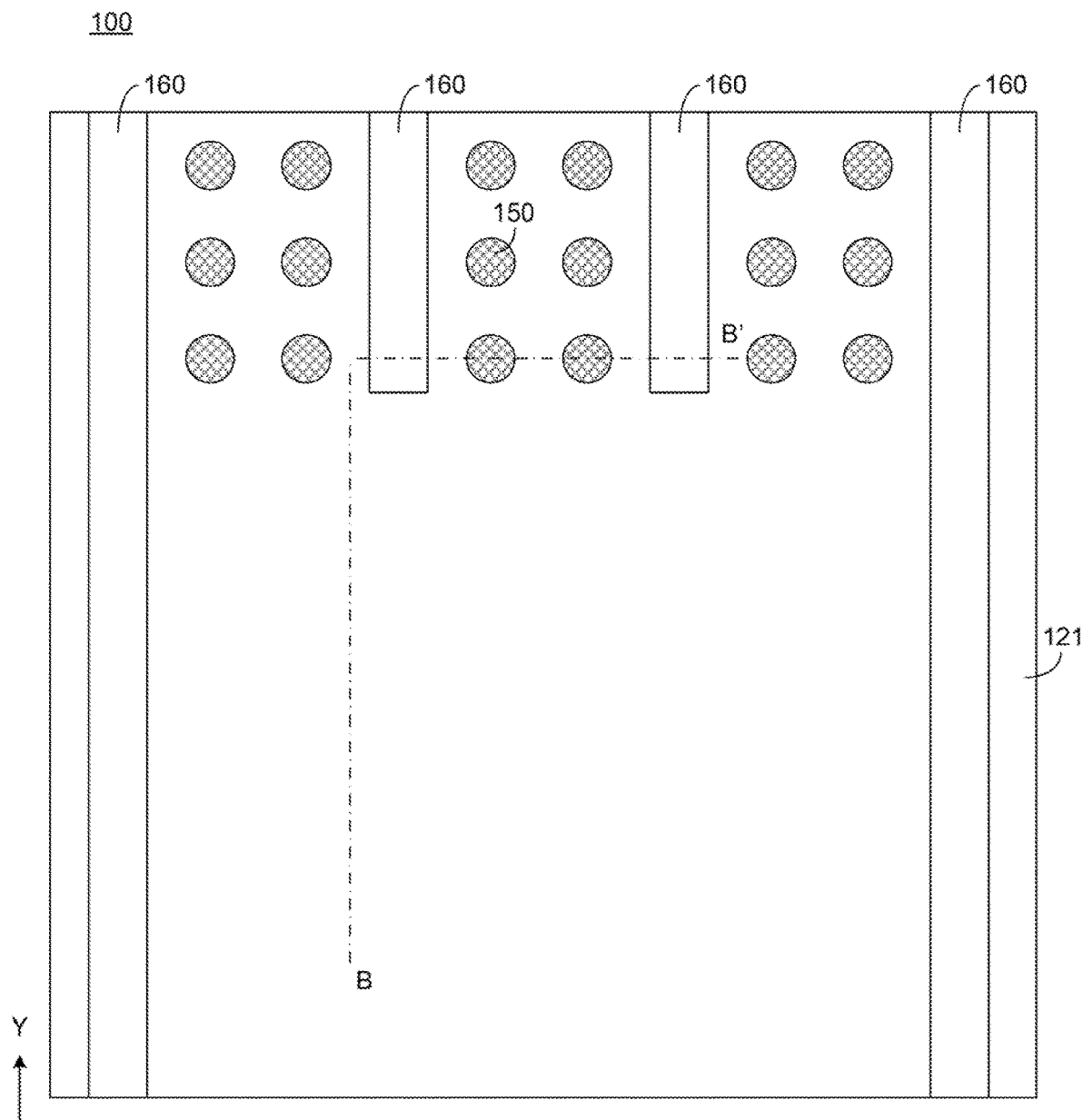
FIGS. 5 and 6 illustrate a top view and a cross-sectional view of the 3D array device shown in FIGS. 3 and 4 after gate line slits are formed according to various embodiments of the present disclosure.
Figure 6:
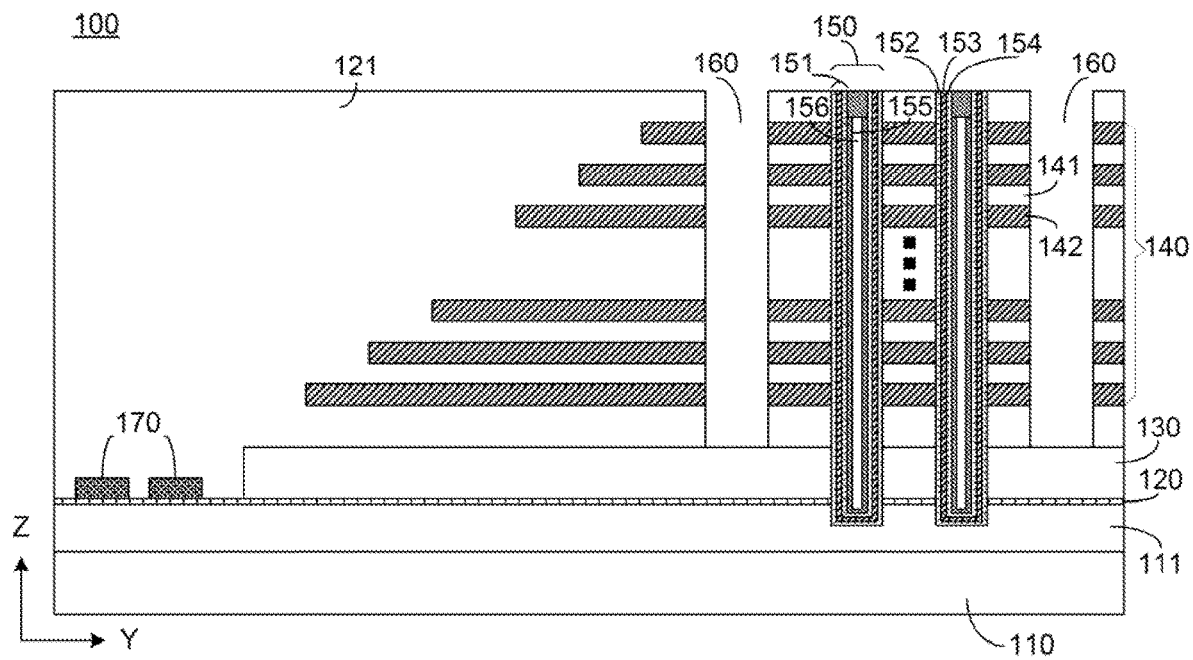

FIGS. 5 and 6 show a schematic top view and a schematic cross-sectional view of the 3D array device 100 after gate line slits 160 are formed according to embodiments of the present disclosure. The cross-sectional view shown in FIG. 6 is taken along a line BB' of FIG. 5. A gate line slit may also be referred to as a gate line slit structure. The 3D array device 100 may have a great number of channel holes 150 arranged in memory planes (not shown). Each memory plane may be divided into memory blocks (not shown) and memory fingers by the gate line slits. For example, the configuration of the channel holes 150 as shown in FIG. 5 may reflect memory fingers among the gate line slits 160.

The gate line slits 160 may be formed by, e.g., a dry etch process or a combination of dry and wet etch processes. As shown in FIGS. 5 and 6, the gate line slits 160 may extend, e.g., in the X direction horizontally, and extend through the layer stack 140 and reach or partially penetrate the sacrificial layer 130 in the Z direction or in a direction approximately perpendicular to the substrate 110. As such, at the bottom of the gate line slit 160, the sacrificial layer 130 is exposed. Then, spacer layers (not shown) may be deposited on the sidewall and bottom of the gate line slit 160 by CVD, PVD, ALD, or a combination of two or more of these processes. The spacer layers are configured to protect the first and second dielectric layers 141 and 142 and may include, for example, silicon oxide and silicon nitride.

After the spacer layers are deposited, selective etching may be performed such that parts of the spacer layers at the bottom of the gate line slits 160 are removed by dry etch or a combination of dry etch and wet etch. The sacrificial layer 130 is exposed again. Subsequently, a selective etch process, e.g., a selective wet etch process, may be performed to remove the sacrificial layer 130. Removal of the sacrificial layer 130 creates a cavity and exposes the cover layer 120 and bottom portions of the blocking layers 152 formed in the channel holes 150. Next, multiple selective etch processes, e.g., multiple selective wet etch processes, may be performed to remove the exposed portions of the blocking layer 152, the charge trap layer 153, and the tunnel insulation layer 154 consecutively, which exposes bottom side potions of the channel layer 155.

When the cover layer 120 is silicon oxide and/or silicon nitride, the cover layer 120 may be removed when the bottom portions of the functional layers 151 are etched away. In certain embodiments, the cover layer 120 may include a material other than silicon oxide or silicon nitride, and the cover layer 120 may be removed by one or more additional selective etch processes. Removal of the cover layer 120 exposes the top surface of the doped region 111.

After the etch processes, the doped region 111 and side portions of the channel layers 155 close to the bottom of the channel hole 150 may be exposed in the cavity left by etching away the sacrificial layer 130 and the cover layer 120. The cavity may be filled by a semiconductor material, e.g., polysilicon, to form a semiconductor layer 131, e.g., by a CVD and/or PVD deposition process. The semiconductor layer 131 may be n-doped, formed on the exposed surface of the doped region 111 and on sidewalls or side portions of the channel layers 155, and electrically connected to the doped region 111 and the channel layers 155.

Optionally, a selective epitaxial growth may be performed such that a layer of single crystalline silicon may be grown on the exposed surface of the doped region 111 and a polysilicon layer may be grown on the exposed surface of the channel layer 155. Thus, the semiconductor layer 131 may include adjoined layers of single crystalline silicon and polysilicon.

Figure 7:
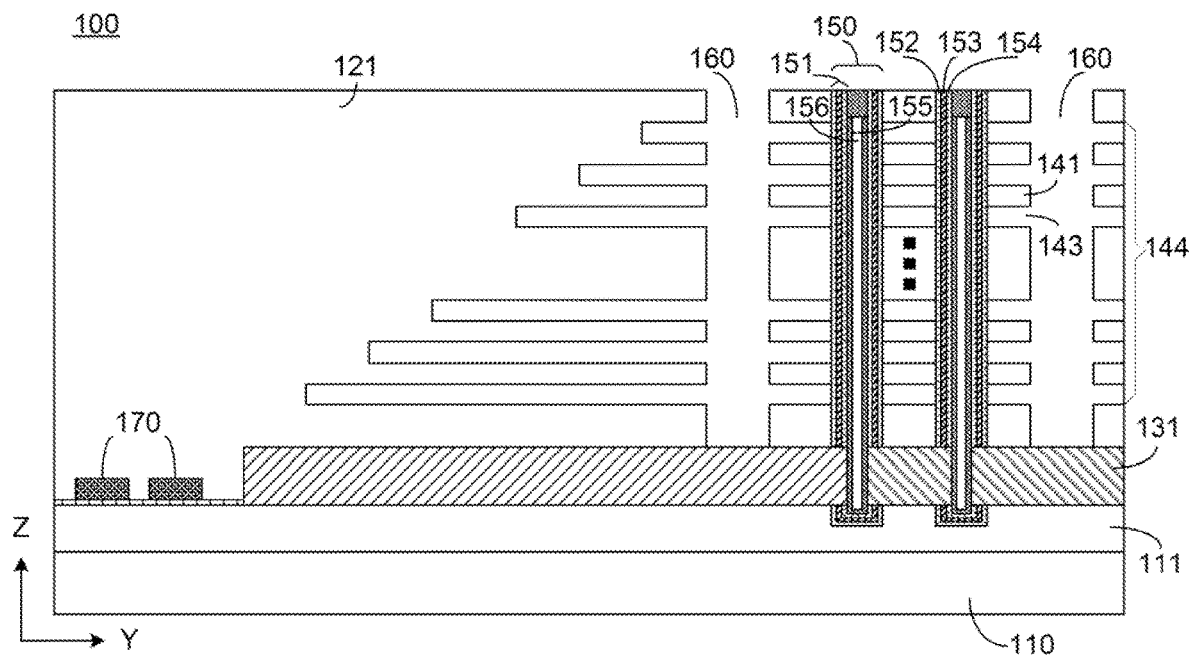
FIGS. 7, 8, and 9 illustrate cross-sectional views of the 3D array device shown in FIGS. 5 and 6 at certain stages in the fabrication process according to various embodiments of the present disclosure.

When the bottom parts of the functional layer 151 and the cover layer 120 are etched, some spacer layers may be etched away and the rest spacer layers may remain on the sidewall of the gate line slits 160 to protect the first and second dielectric layers 141 and 142. After the semiconductor layer 131 is formed, the remaining spacer layers may be removed in a selective etch process, e.g., a selective wet etch process, which exposes the sides of the second dielectric layer 142 around the gate line slits 160. In some embodiments, the innermost spacer layer, which is in contact with the sidewall, is silicon nitride. Because the second dielectric layers 142 are also silicon nitride layers, the innermost spacer layer and the second dielectric layers 142 may be removed together during the etch process, leaving cavities 143 between the first dielectric layers 141, as shown in FIG. 7. As such, the layer stack 140 is changed into a layer stack 144.

Figure 8:
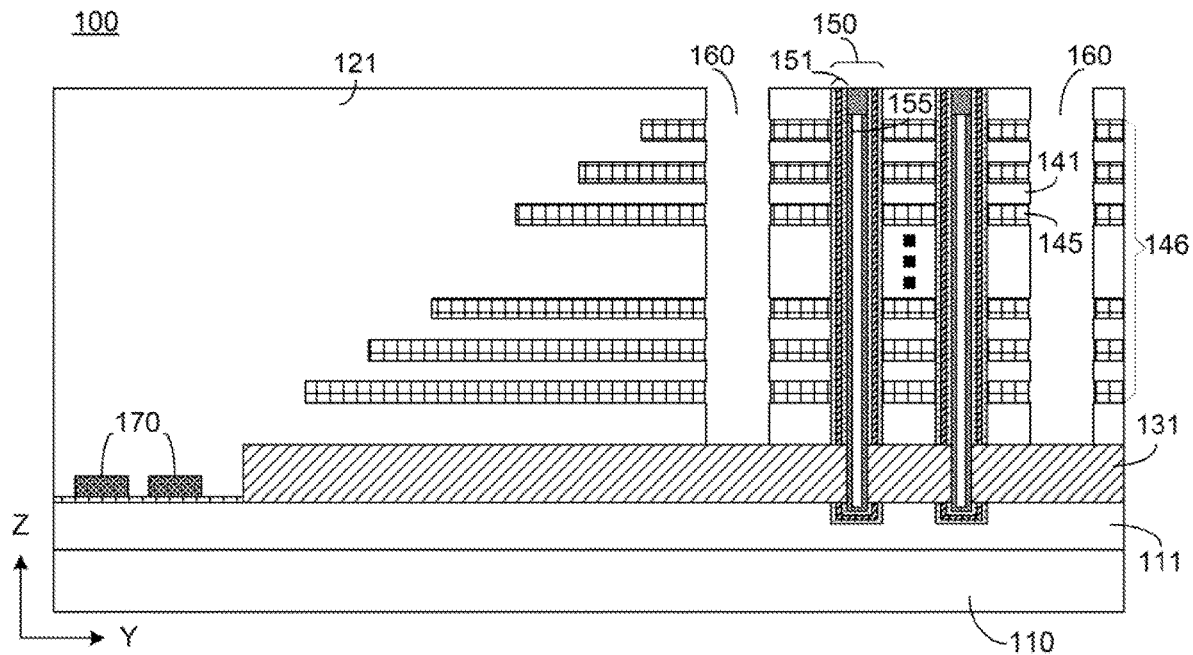

Further, an electrically conductive material such as tungsten (W) may be grown to fill the cavities 143 left by the removal of the second dielectric layers 142, forming conductor layers 145 between the first dielectric layers 141. After the conductor layers 145 are fabricated, the layer stack 144 is converted to a layer tack 146, as shown in FIG. 8. The layer stack 146 includes the first dielectric layers 141 and the conductor layers 145 that are alternatingly stacked over each other. The functional layer 151 and channel layer 155 in the channel hole 150 may be considered as a channel structure. Each channel structure, as shown in FIG. 8, extends through the layer stack 146 and the conductor layers 145 and into the doped region 111. In some embodiments, before metal W is deposited in the cavities 143, a dielectric layer (not shown) of a high-k dielectric material such as aluminum oxide may be deposited, followed by deposition of a layer of an electrically conductive material such as titanium nitride (TiN) (not shown). Further, metal W may be deposited to form the conductor layers 145. CVD, PVD, ALD, or a combination of two or more of these processes may be used in the deposition processes. In some other embodiments, another conductive material, such as cobalt (Co), copper (Cu), aluminum (Al), titanium (Ti), tantalum (Ta), tantalum nitride (TaN), doped silicon, or any combination thereof, may be used to form the conductor layers 145.

Referring to FIG. 8, a portion of each functional layer 151 in a channel hole 150 is between a portion of one of the conductor layers 145 and a portion of a channel layer 155 in the channel hole 150. Each conductor layer 145 is configured to electrically connect rows of NAND memory cells in an X-Y plane and is configured as a word line for the 3D array device 100. The channel layer 155 formed in the channel hole 150 is configured to electrically connect a column or a string of NAND memory cells along the Z direction and configured as a bit line for the 3D array device 100. As such, a portion of the functional layer 151 in the channel hole 150 in the X-Y plane, as a part of a NAND memory cell, is arranged between a conductor layer 145 and a channel layer 155, i.e., between a word line and a bit line.

The functional layer 151 may also be considered as disposed between the channel layer 155 and the layer stack 146. A portion of the conductor layer 145 that is around a portion of the channel hole 150 functions as a control gate or gate electrode for a NAND memory cell. The 3D array device 100 can be considered as including a 2D array of strings of NAND cells (such a string is also referred to as a "NAND string"). Each NAND string contains multiple NAND memory cells and extends vertically toward the substrate 110. The NAND strings form a 3D array of the NAND memory cells.

For the substrate 110, the bottom side may also be referred to as the back side, and the top side, i.e., the side with the doped region 111, may be referred to as the front side or face side. As shown in FIG. 8, the metal layers 170 are formed over a portion of the face side of the substrate 110, and the NAND memory cells are formed over another portion of the face side of the substrate 110.

Figure 9:
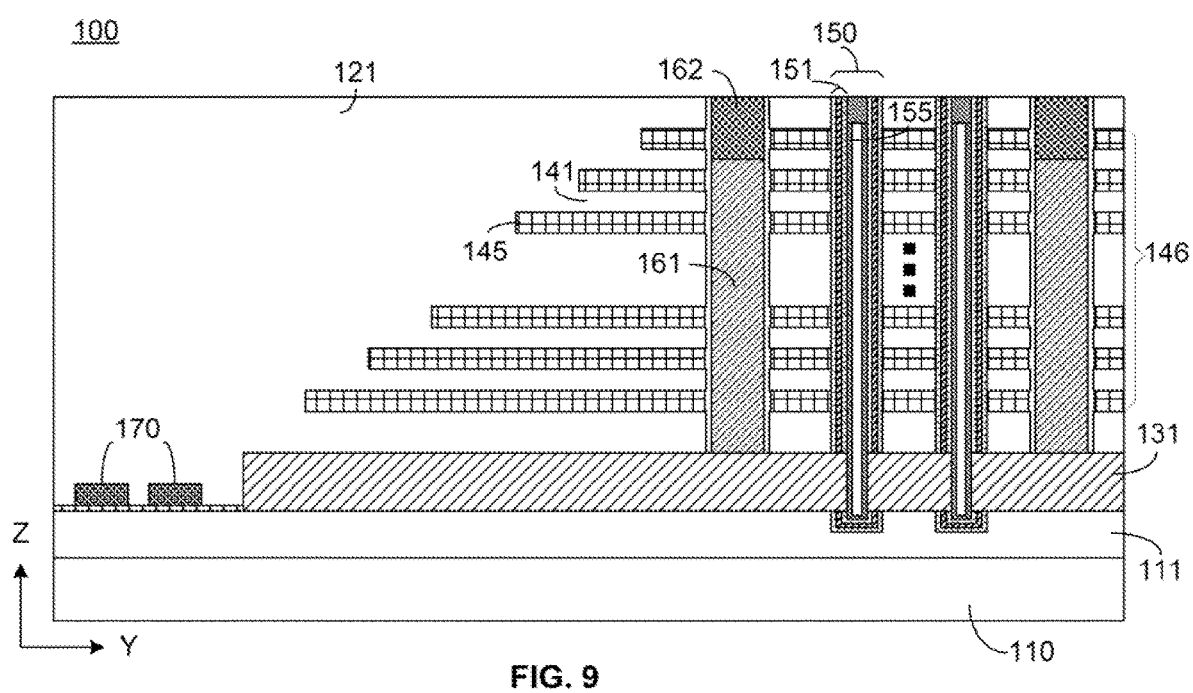

After the conductor layers 145 are grown in the cavities 143, a dielectric layer (e.g., a silicon oxide layer) may be deposited on the sidewalls and bottom surfaces of the gate line slits 160 by CVD, PVD, ALD, or a combination thereof. A dry etch process or a combination of dry etch and wet etch processes may be performed to remove the dielectric layer at the bottom of the gate line slits to expose parts of the semiconductor layer 131. The gate line slits may be filled with a conductive material 161 (e.g., doped polysilicon) and a conductive plug 162 (e.g., metal W). The conductive material 161 in the gate line slit may extend through the layer stack 146 and electrically contact the semiconductor layer 131, as shown in FIG. 9. The filled gate line slits may become an array common source for the 3D array device 100. In some embodiments, forming the array common source in the gate line slits may include depositing an insulation layer, a conductive layer (such as TiN, W, Co, Cu, or Al), and then a conductive material such as doped polysilicon. Optionally, some gate line slits may be filled with a dielectric material. In these cases, some other gate line slits may be filled with a conductive material to work as the array common source.

Figure 10:
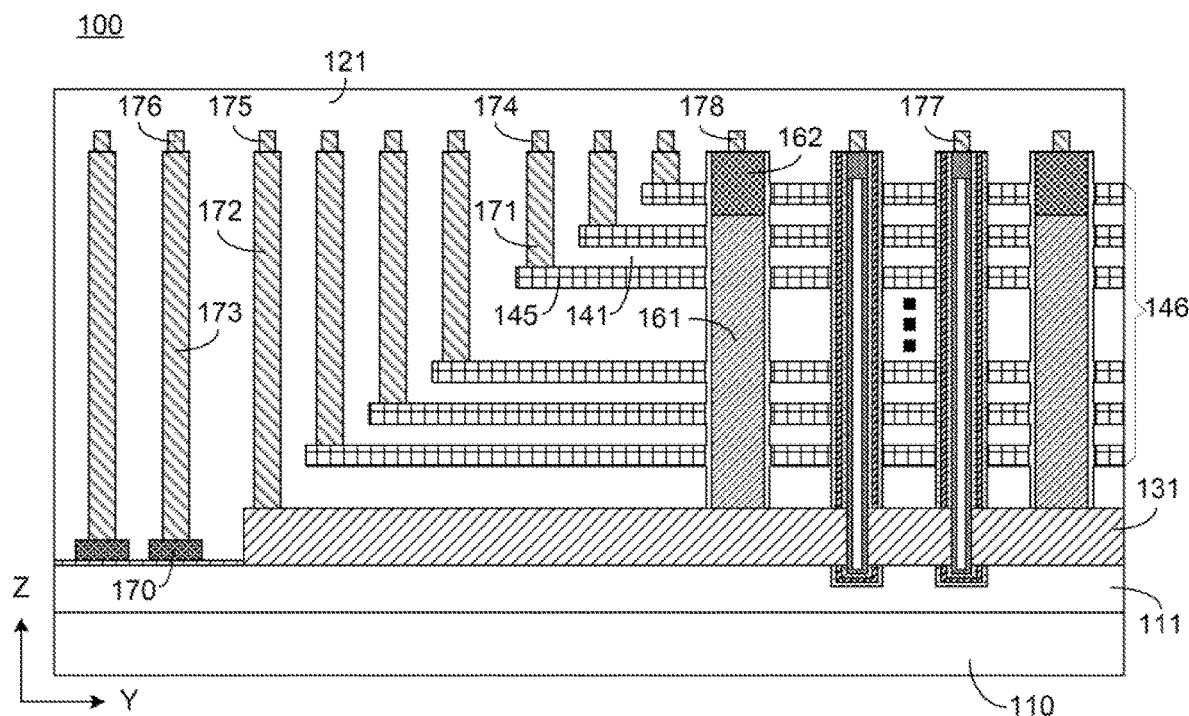
FIGS. 10 and 11 illustrate cross-sectional views of the 3D array device shown in FIG. 9 at certain stages in the fabrication process according to various embodiments of the present disclosure.
Figure 11:
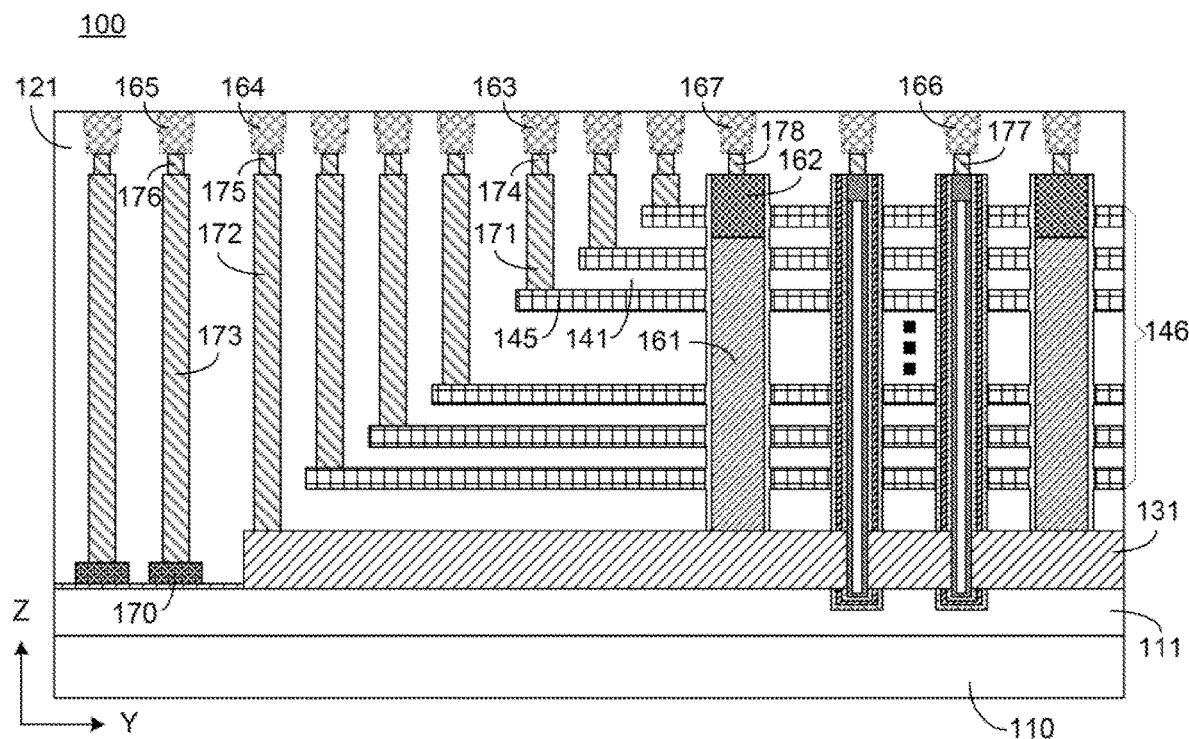

FIGS. 10 and 11 show schematic cross-sectional views of the 3D array device 100 after contacts and vias are formed according to embodiments of the present disclosure. After the gate line slits 160 are filled and the array common source is formed, openings for word line contacts 171, common source contacts 172, and peripheral contacts 173 may be formed by, e.g., a dry etch process or a combination of dry and wet etch processes, to create interconnects for the 3D array device 100. The openings for the contacts 171-173 are then filled with a conductive material by CVD, PVD, ALD, electroplating, electroless plating, or any combination thereof. The conductive material for the contacts 171-173 may include W, Co, Cu, Al, or a combination thereof. Optionally, a layer of a conductive material (e.g., TiN) may be deposited as a contact layer before another conductive material is deposited when the conductive contacts 171-173 are fabricated. When the metal layers 170 are replaced by a single metal layer in some cases, multiple peripheral contacts 173 may still be made to connect the single metal layer.

Further, a CVD or PVD process may be performed to deposit a dielectric material (e.g., silicon oxide or silicon nitride) on the 3D array device 100. The dielectric layer 121 becomes thicker, and openings for vias may be formed by a dry etch process or a combination of dry and wet etch processes. The openings for vias are subsequently filled with a conductive material such as W, Co, Cu, Al, or a combination thereof to form vias 174-178. CVD, PVD, ALD, electroplating, electroless plating, or a combination thereof may be performed. The vias 174, 175, and 176 are electrically connected to the word line contacts 171, common source contacts 172, and peripheral contacts 173, respectively. The via 177 is electrically connected to the upper end of a corresponding NAND string and individually addresses the corresponding NAND string. The vias 178 are electrically connected to plugs 162 of the array common source. Optionally, a layer of a conductive material (e.g., TiN) may be deposited first before filling the openings to form the vias 174-178.

Further, a dielectric material (e.g., silicon oxide or silicon nitride) may be deposited to cover the vias 174-178 and further make the dielectric layer 121 thicker, as shown in FIG. 10. Similar to the formation of the vias 174-178, openings may be made and then filled to form connecting pads 163-167 that serve as interconnects with a peripheral device. As shown in FIG. 11, the connecting pads 163-167 are electrically connected to the vias 174-178, respectively. The connecting pads 163-167 may include W, Co, Cu, Al, or a combination of two or more of these materials. Optionally, a contact layer of a conductive material (e.g., TiN) may be deposited first before filling the openings to form the connecting pads 163-167.

Figure 12:
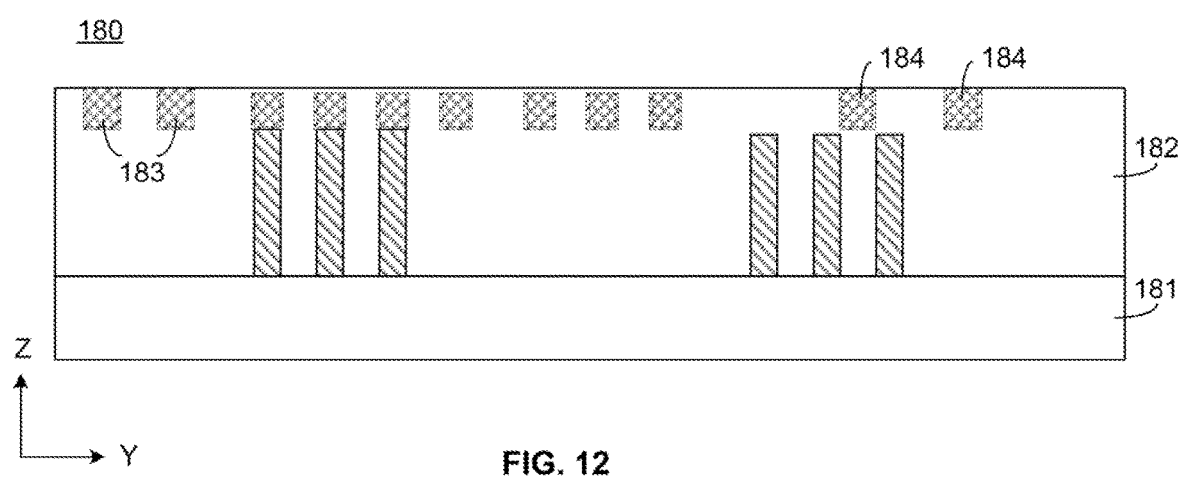
FIG. 12 illustrates a cross-sectional view of an exemplary peripheral device according to various embodiments of the present disclosure.

FIG. 12 shows a schematic cross-sectional view of a peripheral device 180 according to embodiments of the present disclosure. The peripheral device 180 is a part of a memory device and may also be referred to as a peripheral structure. The peripheral device 180 may include a substrate 181 that may include single crystalline silicon, Ge, SiGe, SiC, SOI, GOI, polysilicon, or a Group III-V compound such as GaAs or InP. Peripheral CMOS circuits (e.g., control circuits) (not shown) may be fabricated on the substrate 181 and used for facilitating the operation of the memory device. For example, the peripheral CMOS circuits may include metal-oxide-semiconductor field-effect transistors (MOSFETs) and provide functional devices such as page buffers, sense amplifiers, column decoders, and row decoders. A dielectric layer 182 may be deposited over the substrate 181 and the CMOS circuits. Connecting pads such as connecting pads 183 and 184 and vias may be formed in the dielectric layer 182. The dielectric layer 182 may include one or more dielectric materials such as silicon oxide and silicon nitride. The connecting pads 183 and 184 are configured as interconnects with the 3D array device 100 and may include an electrically conductive material such as W, Co, Cu, Al, or a combination thereof.

Figure 13:
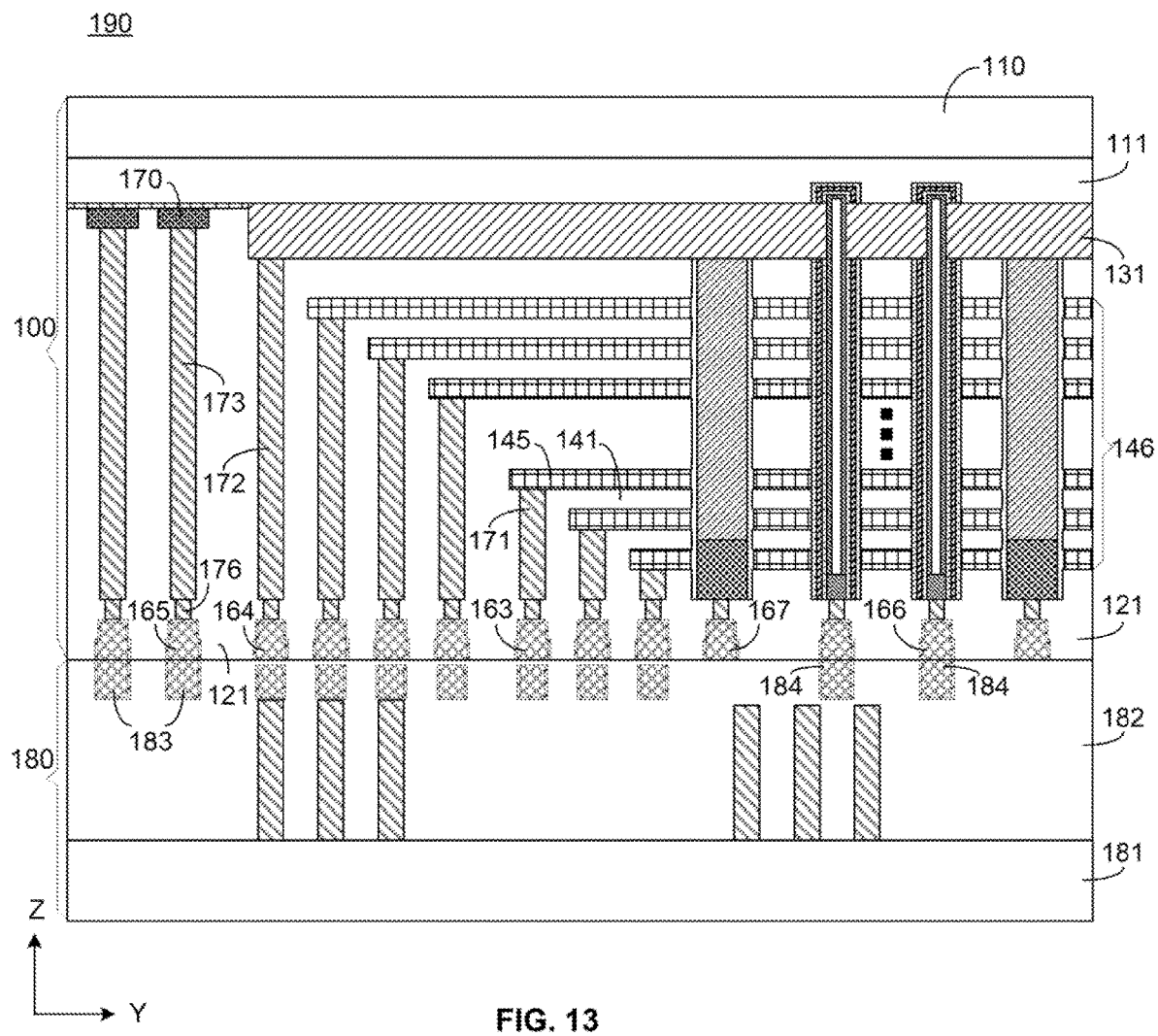
FIG. 13 illustrates a cross-sectional view of an exemplary 3D memory device after the 3D array device shown in FIG. 11 is bonded with the peripheral device shown in FIG. 12 according to various embodiments of the present disclosure.
Figure 14:
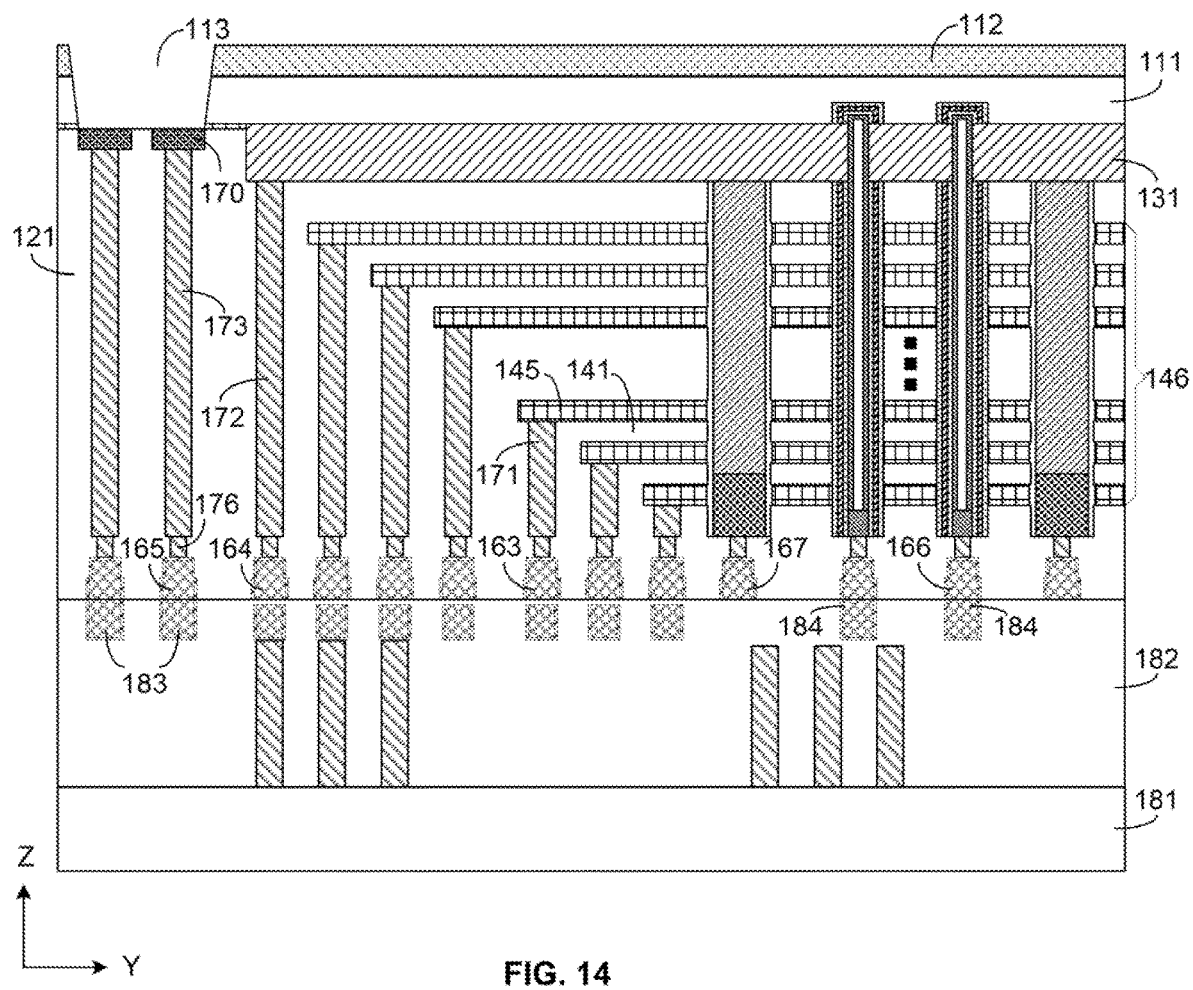
FIGS. 14 and 15 illustrate cross-sectional views of the 3D memory device shown in FIG. 13 at certain stages according to various embodiments of the present disclosure.
Figure 15:
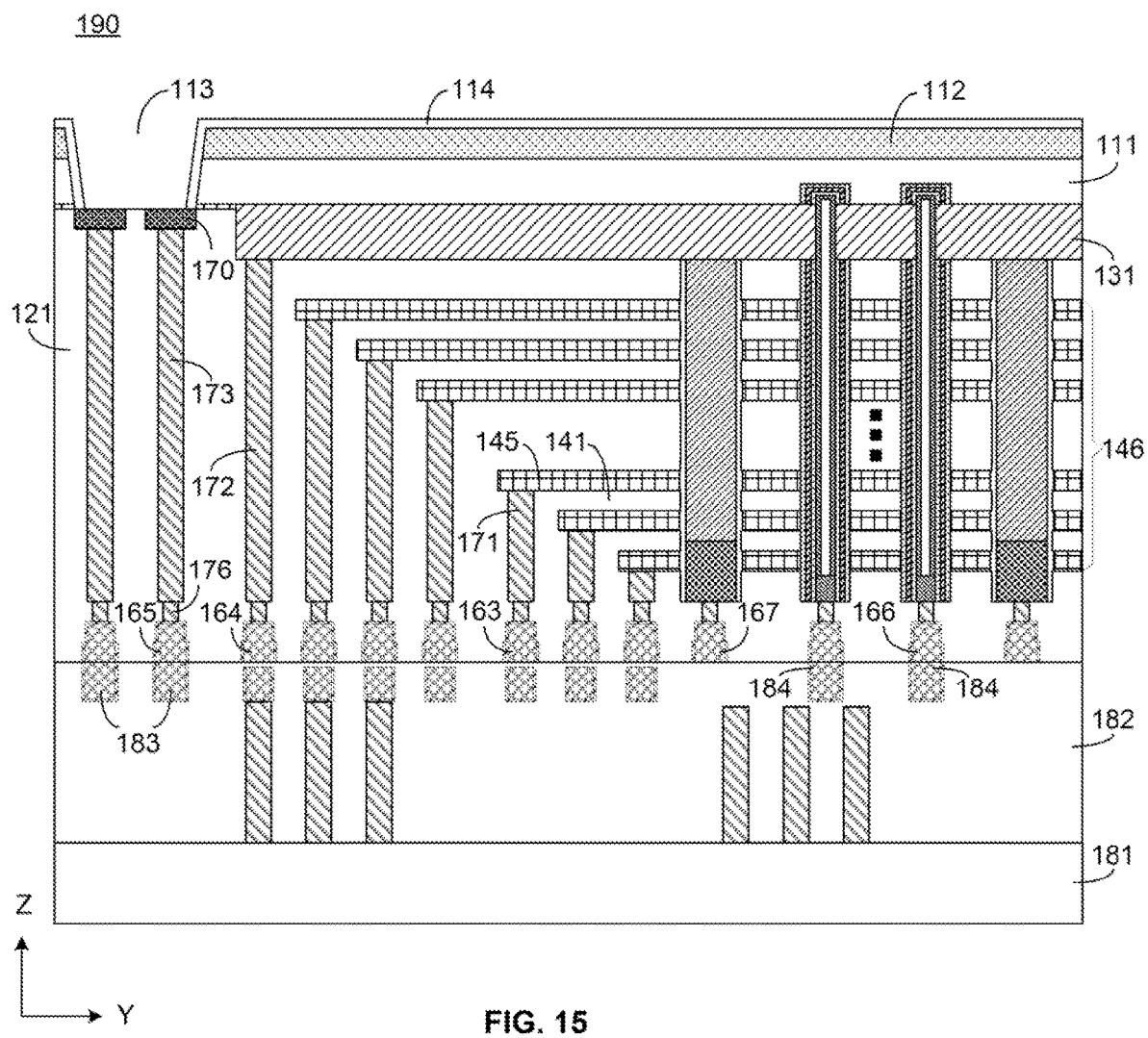

FIGS. 13-15 schematically show fabrication processes of an exemplary 3D memory device 190 according to embodiments of the present disclosure. The cross-sectional views of FIGS. 13-15 are in a Y-Z plane. The 3D memory device 190 may include the 3D array device 100 shown in FIG. 11 and the peripheral device 180 shown in FIG. 12. The peripheral device 180 is configured to control the array device 100.

The 3D array device 100 and peripheral device 180 may be bonded by a flip-chip bonding method to form the 3D memory device 190, as shown in FIG. 13. In some embodiments, the 3D array device 100 may be flipped vertically and become upside down with the top surfaces of the connecting pads 163-167 facing downward in the Z direction. The two devices may be placed together such that the 3D array device 100 is above the peripheral device 180. After an alignment is made, e.g., the connecting pads 165 and 166 may be aligned with the connecting pads 183 and 184, respectively, the 3D array device 100 and peripheral device 180 may be joined and bonded together. The layer stack 146 and the peripheral CMOS circuits become sandwiched between the substrates 110 and 181 or between the doped region 111 and the substrate 181. In some embodiments, a solder or an electrically conductive adhesive may be used to bond the connecting pads 165-166 with the connecting pads 183-184, respectively. As such, the connecting pads 165-166 are electrically connected to the connecting pads 183-184, respectively. The 3D array device 100 and peripheral device 180 are in electrical communication after the flip-chip bonding process is completed.

For the 3D array device 100 and peripheral device 180, the bottom side of the substrate 110 or 181 may be referred to as the back side, and the side with the connecting pads 163-167 or 183-184 may be referred to as the front side or face side. After the flip-chip bonding process, as shown in FIG. 13, the 3D array device 100 and peripheral device 180 are bonded face to face.

Thereafter, from the back side (after the flip-chip bonding), the substrate 110 of the 3D array device 100 may be thinned by a thinning process, such as wafer grinding, dry etch, wet etch, CMP, or a combination thereof. In some embodiments, the substrate 110 may be removed by the thinning process, which may expose the doped region 111. A dielectric layer 112 (e.g., a silicon oxide or silicon nitride layer) may be grown over the doped region 111 by an oxidation process and/or a deposition process (e.g., a CVD or PVD process). An opening 113 may be formed by a dry etch process or a combination of dry etch and wet etch processes. The opening 113 may penetrate through the dielectric layer 112 and the doped region 111 and expose the metal layers 170, as shown in FIG. 14. The exposed metal layers 170, which are beside the staircase structure and the layer stack 146, may be used as contact pads for the 3D memory device 190. For example, bonding wires may be bonded on the metal layers 170 that may connect the 3D memory device 190 with another device. The connecting pad 165, via 176, peripheral contact 173, and the contact pad (i.e., the metal layer 170) are disposed on top of one another and are electrically connected. Thus, each contact pad (i.e., the metal layer 170) is electrically connected to a corresponding connecting pad 183 of the peripheral device 180. The contact pads, peripheral contacts 173, vias 176, and connecting pads 165 are horizontally surrounded by the dielectric region 121 that extends vertically from the contact pads (i.e., the metal layer 170) to the connecting pads 165. The peripheral contact 173 and via 176 may be considered as an electrically conductive channel. The conductive channel is surrounded by the dielectric region 121 horizontally and extends towards the connecting pad 183 of peripheral device 180 along a channel direction. Horizontally, the contact pads and conductive channel are spaced apart from the layer stack 146 by certain distances respectively along a direction perpendicular to the channel direction (e.g., the Y direction). In some embodiments, the staircase structure may be arranged between the conductive channel and the layer stack 146.

Further, a dielectric material may be deposited to form a dielectric layer 114 above the dielectric layer 112 and on the sidewall and bottom of the opening 113. The dielectric layer 114 may serve as a passivation layer that may include a material such as silicon oxide, silicon nitride, silicon oxynitride, tetraethyl orthosilicate (TEOS), or a combination thereof. The dielectric layer 114 may be formed by a deposition process such as CVD or PVD. Next, a dry etch process or dry and wet etch processes may be performed to remove a portion of the dielectric layer 114 at the bottom of the opening 113. The metal layers 170 become exposed again. The dielectric layer 112 and 114 together may also be considered as a top insulating layer. As shown in FIG. 15, the metal layers 170 and the peripheral contacts 173 may be disposed between a portion (e.g., a first portion) of the top insulating layer and the peripheral device 180, and the layer stack 146 and the NAND memory cells may be disposed between another portion (e.g., a second portion) of the top insulating layer and the peripheral device 180. The opening 113 is formed through the first portion of the top insulating layer and exposes the metal layers 170 disposed at the bottom of the opening 113 from the back side of the array device 100. As shown in FIG. 2, the metal layers 170 may be disposed over the cover layer 120, buried by the dielectric layer 121, and beside the staircase structure in all scenarios and cases described above. Further, the metal layers 170 may be disposed at a level of the sacrificial layer 130 with regard to the substrate 110, as shown in FIG. 2. As used herein, a level indicates an X-Y plane along the Z axis. A level of the sacrificial layer 130 indicates an X-Y plane that passes through the sacrificial layer 130. The height of a level, i.e., the height of an X-Y plane at the level, is measured against the Z axis. Because the sacrificial layer 130 is replaced by the semiconductor layer 131, after the array device 100 is flip boded, the contact pads (i.e., the metal layers 170) may be considered at a level of the semiconductor layer 131 and substantially proximate to the top insulating layer with regard to the peripheral device 180.

Thereafter, other fabrication steps or processes may be performed to complete fabrication of the 3D memory device 190. Details of the other fabrication steps or processes are omitted for simplicity.

If the contact pads of the 3D memory device 190 are formed after the 3D array device 100 and the peripheral device 180 are bonded together, because plasma processing is used several times during the formation of the contact pads, PID can occur to the peripheral CMOS circuits of the peripheral device 180 and cause yield and reliability issues. As shown in FIGS. 13-15, the metal layers 170 become the contact pads of the 3D memory device 190 after the flip-chip boding process. That is, some plasma processing steps are performed during the fabrication of the 3D array device 100, instead of after the 3D array device 100 and the peripheral device 180 are bonded together. Because the contact pads are formed before the flip-chip bonding process, the peripheral device 180 may experience fewer plasma processing steps after being bonded with the 3D array device 100, and thus less PID may occur to the peripheral CMOS circuits. Hence, fabrication of the metal layers 170 may reduce the effects of PID and improve the yield and reliability of the 3D memory device 190.

Figure 16:
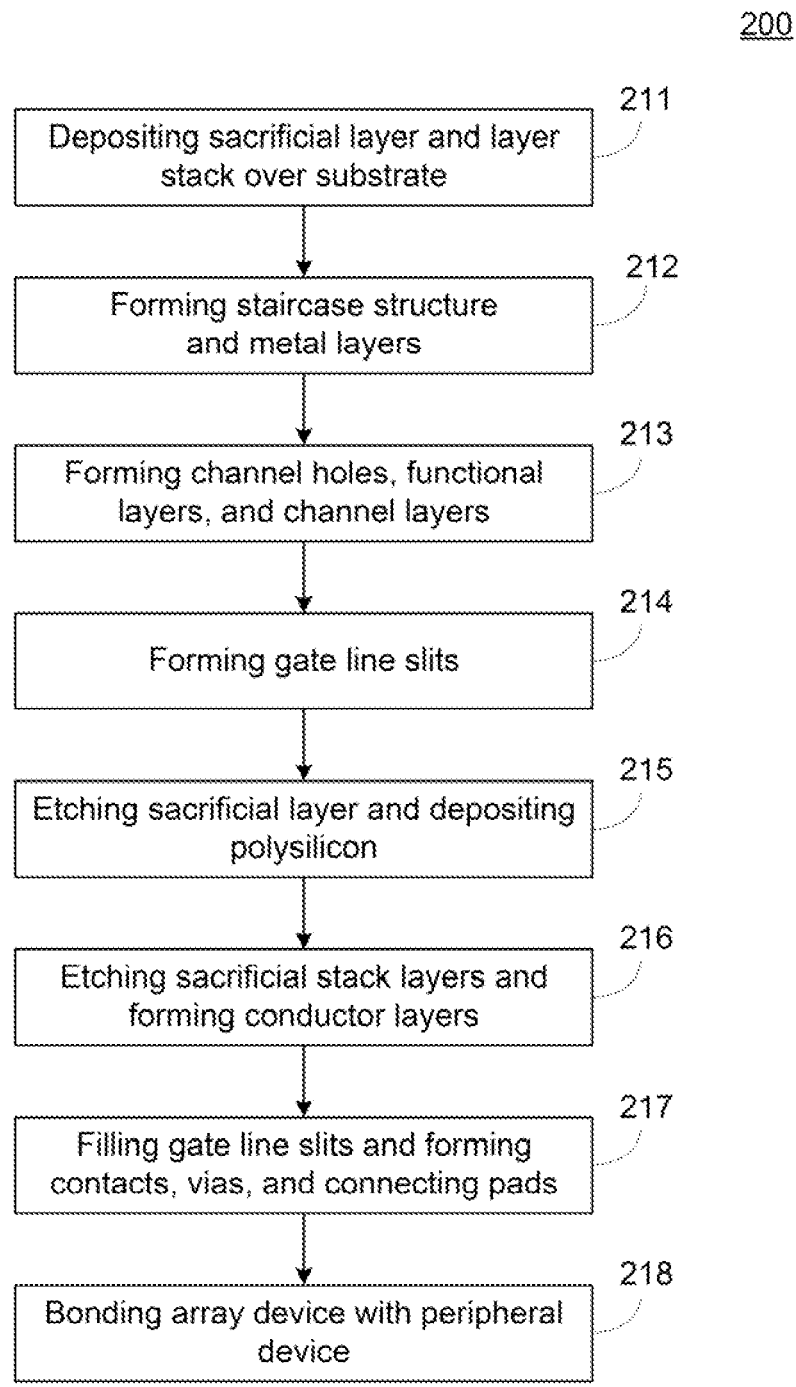
FIG. 16 illustrates a schematic flow chart of fabrication of a 3D memory device according to various embodiments of the present disclosure.

FIG. 16 shows a schematic flow chart 200 for fabricating a 3D memory device according to embodiments of the present disclosure. At 211, a sacrificial layer may be deposited over a top surface of a substrate for a 3D array device. The substrate may include a semiconductor substrate, such as a single crystalline silicon substrate. In some embodiments, a cover layer may be grown on the substrate before depositing the sacrificial layer. The cover layer may include a single layer or multiple layers that are grown sequentially over the substrate. For example, the cover layer may include silicon oxide, silicon nitride, and/or aluminum oxide. In some other embodiments, the sacrificial layer may be deposited without first depositing the cover layer over the substrate. The sacrificial layer may include single crystalline silicon, polysilicon, silicon oxide, or silicon nitride.

Over the sacrificial layer, a layer stack of the 3D array device may be deposited. The layer stack may include a first stack layer and a second stack layer that are alternately stacked. The first stack layer may include a first dielectric layer and the second stack layer may include a second dielectric layer that is different than the first dielectric layer. In some embodiments, one of the first and second dielectric layers is used as a sacrificial stack layer.

At 212, a staircase formation process may be performed to convert a portion of the layer stack into a staircase structure. The staircase formation process may include multiple etches that are used to trim the portion of the layer stack into the staircase structure. Metal layers may be formed that are beside and spaced apart from the staircase structure horizontally and above the substrate vertically. A deposition process may be performed to deposit a dielectric layer to bury or cover the metal layers and the staircase structure.

At 213, channel holes may be formed that extend through the layer stack and the sacrificial layer to expose portions of the substrate. A functional layer and a channel layer may be deposited on the sidewall and bottom surface of each channel hole. Forming the functional layer may include depositing a blocking layer on the sidewall of the channel hole, depositing a charge trap layer on the blocking layer, and depositing a tunnel insulation layer on the charge trap layer. The channel layer, deposited on the tunnel insulation layer, functions as a semiconductor channel and may include a polysilicon layer.

At 214, gate line slits of the 3D array device may be formed. Along the vertical direction, the gate line slits may extend through the layer stack. After the gate line slits are etched, portions of the sacrificial layer are exposed.

At 215, the sacrificial layer may be etched away and a cavity may be created above the substrate. The cavity exposes a bottom portion of the blocking layer of the functional layer in the cavity. The cover layer is also exposed in the cavity, if it is deposited on the substrate. The layers of the functional layer exposed sequentially in the cavity, including the blocking layer, the charge trap layer, and the tunnel insulation layer, are etched away by, e.g., one or more selective etch processes, respectively. As a result, a portion of the functional layer that is close to the substrate may be removed in the cavity. The cover layer, if deposited, also may be etched away during the process to etch the portion of the functional layer or in another selective etch process. Hence, a portion of the substrate and portions of the channel layers are exposed in the cavity.

Thereafter, a deposition process may be performed to grow a semiconductor layer such as a polysilicon layer in the cavity. The semiconductor layer electrically contacts the channel layers and the substrate.

In some embodiments, the layer stack may include two dielectric stack layers and one of the stack layers is sacrificial. The sacrificial stack layers may be etched away at 216 to leave cavities, which then may be filled with an electrically conductive material to form the conductor layers. The electrically conductive material may include a metal such as W, Co, Cu, Al, Ti, or Ta.

At 217, a dielectric layer such as an oxide layer may be deposited on the side walls and bottom surfaces of the gate line slits. Portions of the dielectric layer on the bottom surfaces may be etched out selectively to expose the semiconductor layer. Electrically conductive materials, such as TiN, W, Cu, Al, and/or doped polysilicon may be deposited in the gate line slits to form an array common source that electrically contacts the semiconductor layer.

Etching and filling processes may be performed to form word line contacts, peripheral contacts, vias that are electrically connected to the word line contacts and peripheral contacts, and connecting pads that are electrically connected to the vias. The peripheral contacts are electrically connected to the metal layers beside the staircase structure. The connecting pads are configured for interconnection between the 3D array device and a peripheral device.

At 218, a flip-chip bonding process may be performed to bond the 3D array device and the peripheral device or fasten the 3D array device with the peripheral device to create a 3D memory device. In some embodiments, the 3D array device may be flipped upside down and positioned above the peripheral device. The connecting pads of the 3D array device and the peripheral device may be aligned and then bonded. The substrate of the 3D array device may be thinned. An etch process may be performed to expose the metal layers, which may be used as contact pads for the 3D memory device.

FIGS. 17-21 schematically show a fabrication process of an exemplary 3D array device 300 according to embodiments of the present disclosure. Among FIGS. 17-21, the cross-sectional views are in a Y-Z plane.

Figure 17:
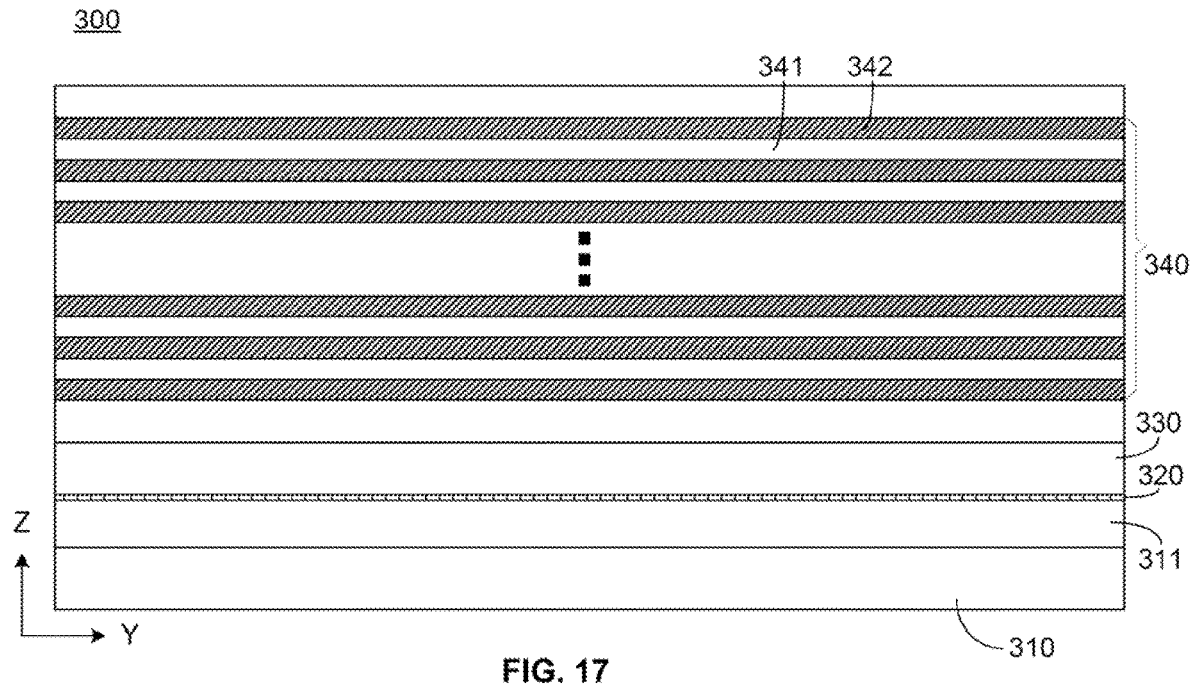
FIGS. 17 and 18 illustrate cross-sectional views of an exemplary 3D array device at certain stages during a fabrication process according to various embodiments of the present disclosure.

As shown in FIG. 17, the 3D array device 300 may include a substrate 310. The substrate 310 may include a single crystalline silicon layer, or may include another semiconductor material such as Ge, SiGe, SiC, SOI, GOI, polysilicon, GaAs, or InP. In the following descriptions, as an example, the substrate 310 includes an undoped or lightly doped single crystalline silicon layer.

In some embodiments, a top portion of the substrate 310 may be doped by n-type dopants to form a doped region 311. As shown in FIG. 17, a cover layer 320 may be deposited over the doped region 311. The cover layer 320 is a sacrificial layer and may include a single layer or multiple layers. For example, the cover layer 320 may include one or more of silicon oxide layer and silicon nitride layer. The cover layer 320 may be deposited by CVD, PVD, ALD, or a combination of two or more of these methods. In some other embodiments, the cover layer 320 may include another material such as aluminum oxide.

Over the cover layer 320, a sacrificial layer 330 may be deposited. The sacrificial layer 330 may include a semiconductor material or dielectric material. In descriptions bellow, as an example, the sacrificial layer 330 is a polysilicon layer. After the sacrificial layer 330 is formed, a layer stack 340 may be deposited. The layer stack 340 includes multiple pairs of stack layers 341 and 342, i.e., the stack layers 341 and 342 are stacked alternately.

In some embodiments, the stack layers 341 and 342 may include a first dielectric material and a second dielectric material that is different from the first dielectric material. The alternating stack layers 341 and 342 may be deposited via CVD, PVD, ALD, or any combination thereof. In descriptions bellow, exemplary materials for the stack layers 341 and 342 are silicon oxide and silicon nitride, respectively. The silicon oxide layer may be used as an isolation stack layer and the silicon nitride layer may be used as a sacrificial stack layer.

Figure 18:
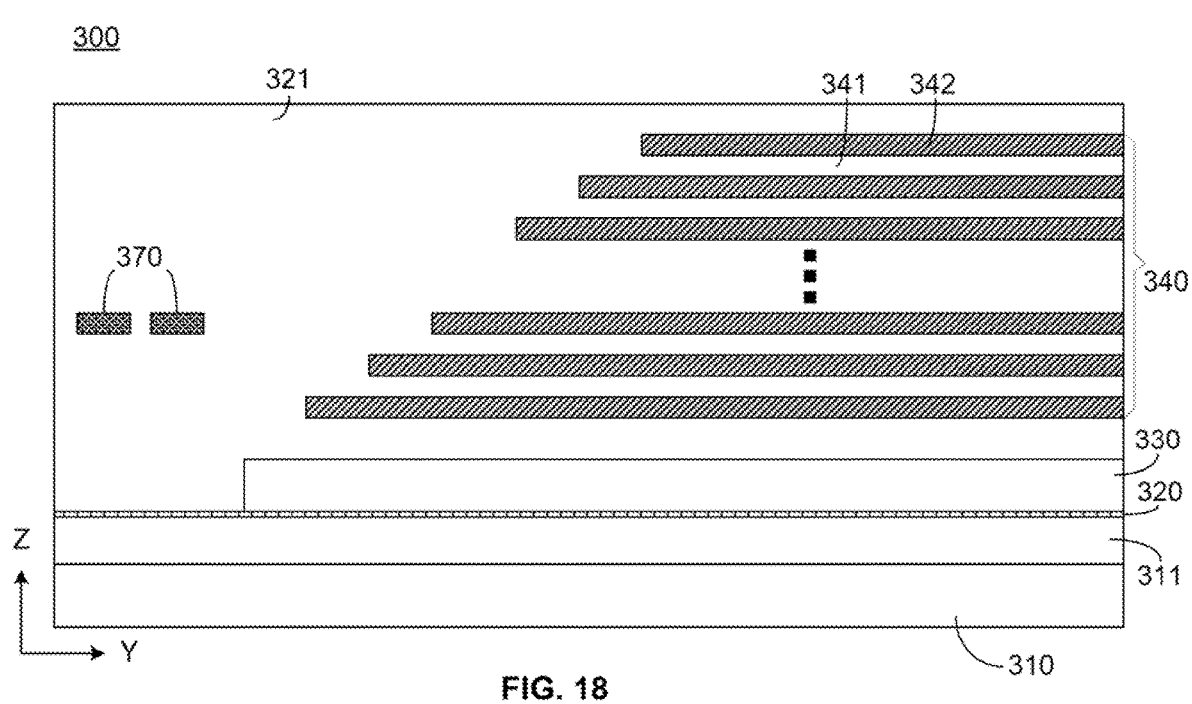

After the layer stack 340 is deposited, a staircase formation process may be performed to trim a part of the layer stack 340 into a staircase structure, as shown in FIG. 18. The staircase structure may be covered by a dielectric material such as silicon oxide that forms a dielectric layer 321.

After the staircase structure is covered by the dielectric layer 321, as shown in FIG. 18, metal layers 370 may be grown on a portion of the dielectric layer 321 by CVD, PVD, ALD, electroplating, electroless plating, or any combination thereof. Horizontally, the metal layers 370 may be beside and spaced apart by a certain distance from the staircase structure. Vertically (i.e., along the Z direction), the metal layers 370 may be above the cover layer 320 or above the substrate 310 and embedded in the dielectric layer 321. The metal layers 370 may also be formed around a middle region between the top and the bottom of the dielectric layer 321. In some embodiments, the metal layers 370 may also be formed close to the doped region 311 or the bottom of the dielectric layer 321. Alternatively, the metal layers 370 may be formed close to the top of the dielectric layer 321. The distance from the metal layers 370 to the substrate 111 may be determined based on specific application. For example, the metal layers 370 may be formed at a distance from the substrate as same as an interconnect layer or other conductive layer in the staircase structure. During the formation of the staircase structure, an opening beside the staircase may be made and then filled with the dielectric layer 321. In some embodiments, the metal layers 370 may be deposited when the opening is partially filled. Then the opening may be fully filled and the metal layers may be buried in the dielectric layer 321. Alternatively, the opening may be fully filled and a new opening may be formed by etch and the metal layers 370 may be deposited at the bottom of the new opening. The dielectric material may be deposited to fill the new opening and bury the metal layers 370. The metal layers 370 may be exposed subsequently to become contact pads as illustrated in descriptions below.

Figure 19:
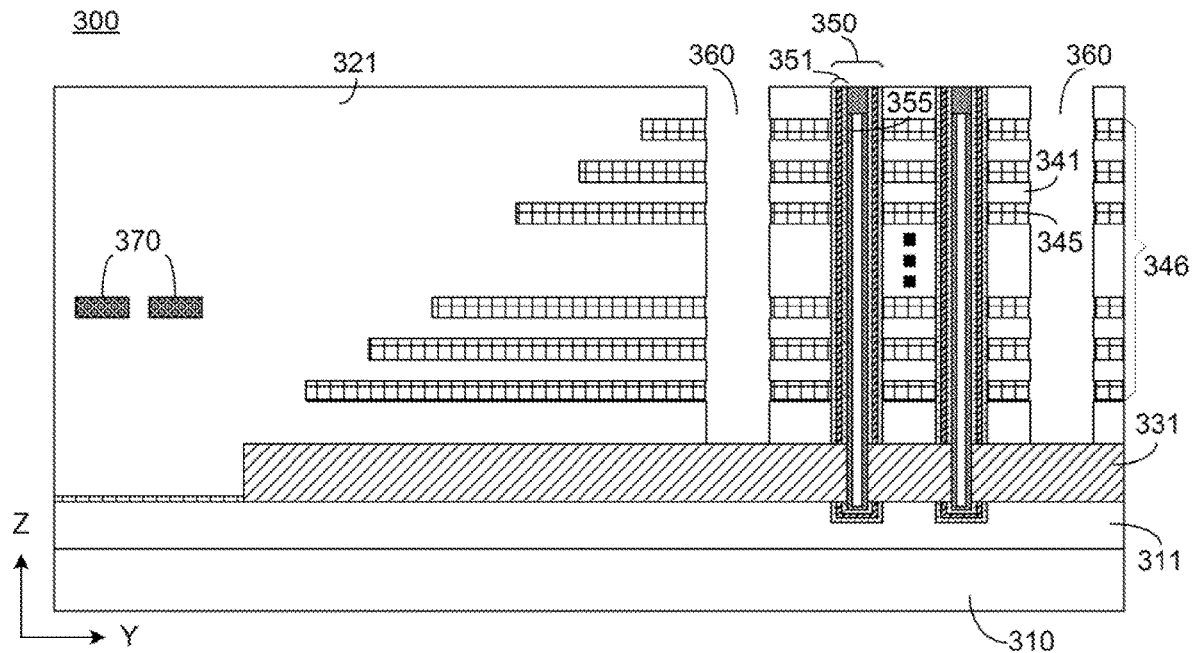
FIGS. 19, 20, and 21 illustrate cross-sectional views of the 3D array device shown in FIG. 18 at certain stages in the exemplary fabrication process according to various embodiments of the present disclosure.
Figure 20:
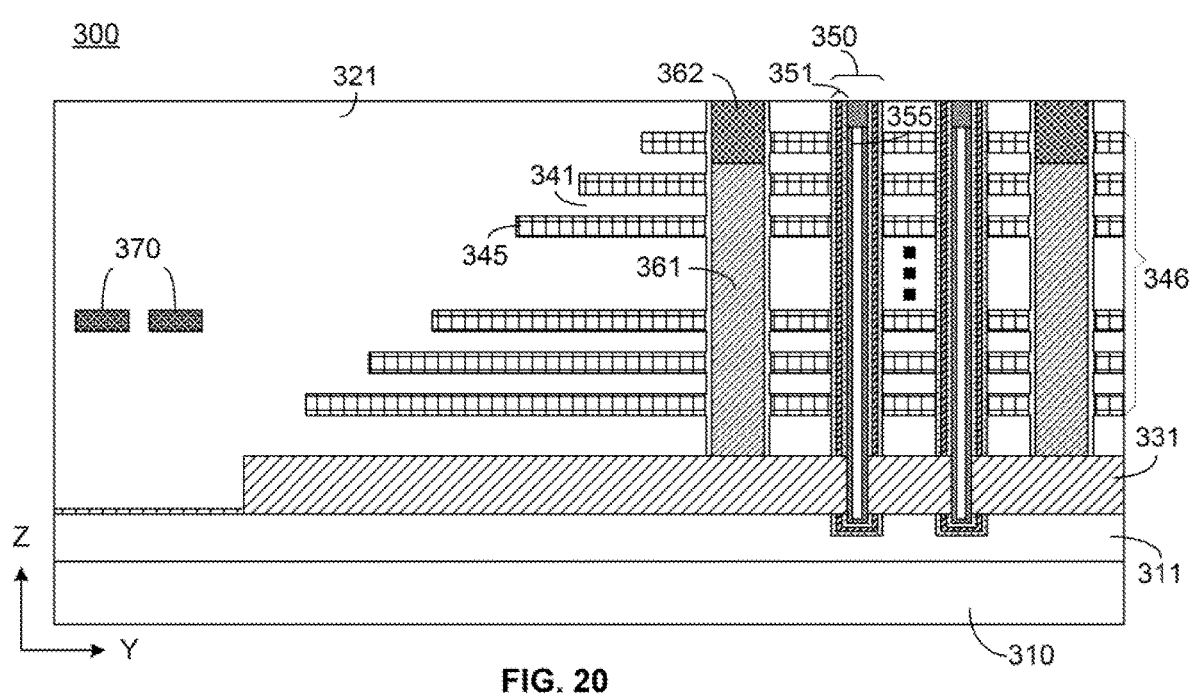
Figure 21:
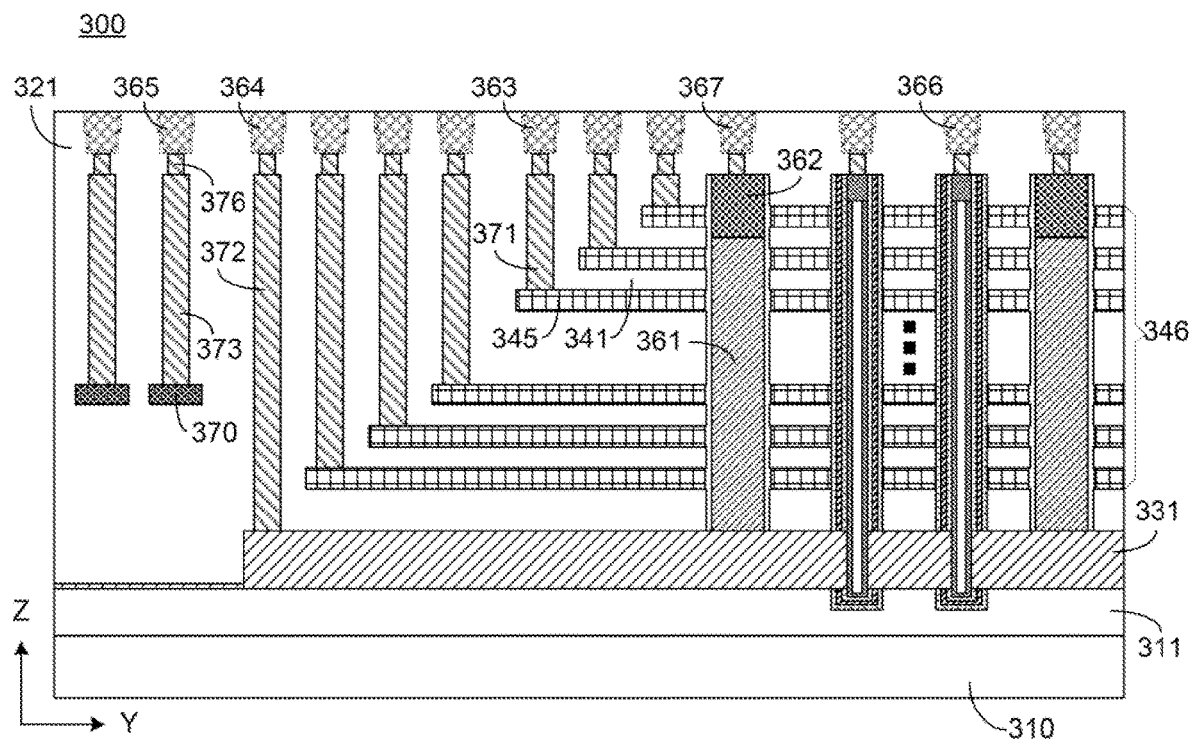

FIGS. 19, 20, and 21 show schematic cross-sectional views of the 3D array device 300 at certain stages according to embodiments of the present disclosure. After the metal layers 370 are formed, channel holes 350 may be formed in the layer stack 340. The quantity, dimension, and arrangement of the channel hole 350 shown in FIGS. 19-21 are exemplary and for description of structures and fabrication methods.

The channel holes 350 may have a cylinder shape or pillar shape that extends through the layer stack 340, the sacrificial layer 330, and the cover layer 320, and partially penetrates the doped region 311. After the channel holes 350 are formed, a functional layer 351 may be deposited on the sidewall and bottom of the channel hole. The functional layer 351 may include a blocking layer on the sidewall and bottom of the channel hole, a charge trap layer on a surface of the blocking layer, and a tunnel insulation layer on a surface of the charge trap layer.

In some embodiments, the functional layer 351 may include the ONO structure, which is used in descriptions below. For example, a silicon oxide layer may be deposited on the sidewall of the channel hole 350 as the blocking layer. A silicon nitride layer may be deposited on the blocking layer as the charge trap layer. Another silicon oxide layer may be deposited on the charge trap layer as the tunnel insulation layer. On the tunnel insulation layer, a polysilicon layer may be deposited as a channel layer 355. Like the channel holes, the channel layer 355 may also extend through the layer stack 340 and into the doped region 311. The channel holes 350 may be filled by an oxide material after the channel layers 355 are formed. The channel hole 350 may be sealed by a plug that includes an electrically conductive material (e.g., metal W) and electrically contacts the channel layer 355.

Further, gate line slits 360 may be formed by a dry etch process or a combination of dry and wet etch processes. The gate line slits 360 may extend through the layer stack 340 and reach or partially penetrate the sacrificial layer 330 in the Z direction. As such, at the bottom of the gate line slits 360, parts of the sacrificial layer 330 are exposed. Spacer layers (not shown) may be deposited on the sidewall and bottom of the gate line slit 360, and portions of the spacer layers at the bottom of the slits 360 may be removed by etch to expose the sacrificial layer 330 again. Then the sacrificial layer 330 is etched out. Removal of the sacrificial layer 330 creates a cavity and exposes the cover layer 320 and bottom portions of the blocking layers formed in the channel holes 350. Portions of the blocking layer, the charge trap layer, and the tunnel insulation layer are etched away, exposing bottom portions of the channel layer 355. The cover layer 320 may be removed when the bottom portions of the functional layer 351 are etched away or in an additional selective etch process, exposing a top surface of the doped region 311.

The cavity may be filled by a semiconductor material, e.g., polysilicon, to form a semiconductor layer 331. The semiconductor layer 331 may be deposited on surfaces of the exposed portions of the doped region 311 and the channel layer 355. Further, the sacrificial stack layers 342 may be removed by etch and replaced by conductor layers 345 that include an electrically conductive material such as W. The layer stack 340 becomes a layer stack 346 after the conductor layers 345 are formed, as shown in FIG. 19.

Each conductor layer 345 is configured to electrically connect one or more rows of NAND memory cells along the Y direction or in the X-Y plane and is configured as a word line for the 3D array device 300. The channel layer 355 formed in the channel hole 350 is configured to electrically connect a NAND string along the Z direction and configured as a bit line for the 3D array device 300.

The gate line slits 360 may be filled with a conductive material 361 (e.g., doped polysilicon) and a conductive plug 362 (e.g., metal W), as shown in FIG. 20. In some embodiments, the filled gate line slits may become an array common source for the 3D array device 300.

Thereafter, openings for word line contacts 371, common source contacts 372, and peripheral contacts 373 may be formed. The openings are filled with a conductive material (e.g., W, Co, Cu, Al, or any combination thereof) to form the contacts 371-373. The peripheral contacts 373 are disposed over and electrically connected to the metal layers 370, respectively.

Further, a CVD or PVD process may be performed to deposit a dielectric material (e.g., silicon oxide or silicon nitride) on the 3D array device 300. The dielectric layer 321 becomes thicker. Further, openings for vias may be formed and subsequently filled with a conductive material such as W, Co, Cu, or Al. Some vias are electrically connected to the word line contacts 371, common source contacts 372, and peripheral contacts 373, respectively. For example, a via 376 is connected with one of the peripheral contacts 373. Some vias are electrically connected to the plugs 362 and the upper ends of the NAND strings.

A dielectric material (e.g., silicon oxide or silicon nitride) may be deposited to bury the vias and further make the dielectric layer 321 thicker. Openings may be made and then filled with W, Co, Cu, or Al to form connecting pads 363, 364, 365, 366, and 367. As shown in FIG. 21, the connecting pads 363-367 are electrically connected to the vias, respectively.

Figure 22:
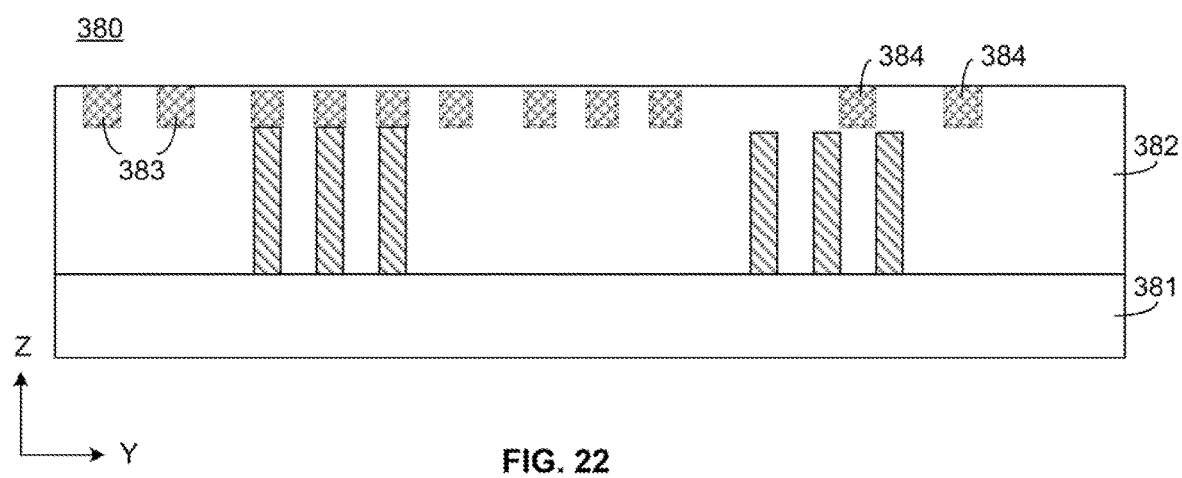
FIG. 22 illustrates a cross-sectional view of an exemplary peripheral device according to various embodiments of the present disclosure.

FIG. 22 schematically shows a peripheral device 380 in a cross-sectional view according to embodiments of the present disclosure. The peripheral device 380 may include a semiconductor substrate 381 (e.g., a substrate of single crystalline silicon). Peripheral CMOS circuits (e.g., control circuits) (not shown) may be fabricated on the substrate 381 and used for facilitating the operation of the 3D array device 300. A dielectric layer 382 including one or more dielectric materials may be deposited over the substrate 381. Connecting pads such as connecting pads 383 and 384 and vias may be formed in the dielectric layer 382. The connecting pads 383 and 384 are configured for interconnecting with the 3D array device 300 and may include an electrically conductive material (e.g., W, Co, Cu, Al, or any combination thereof).

Figure 23:
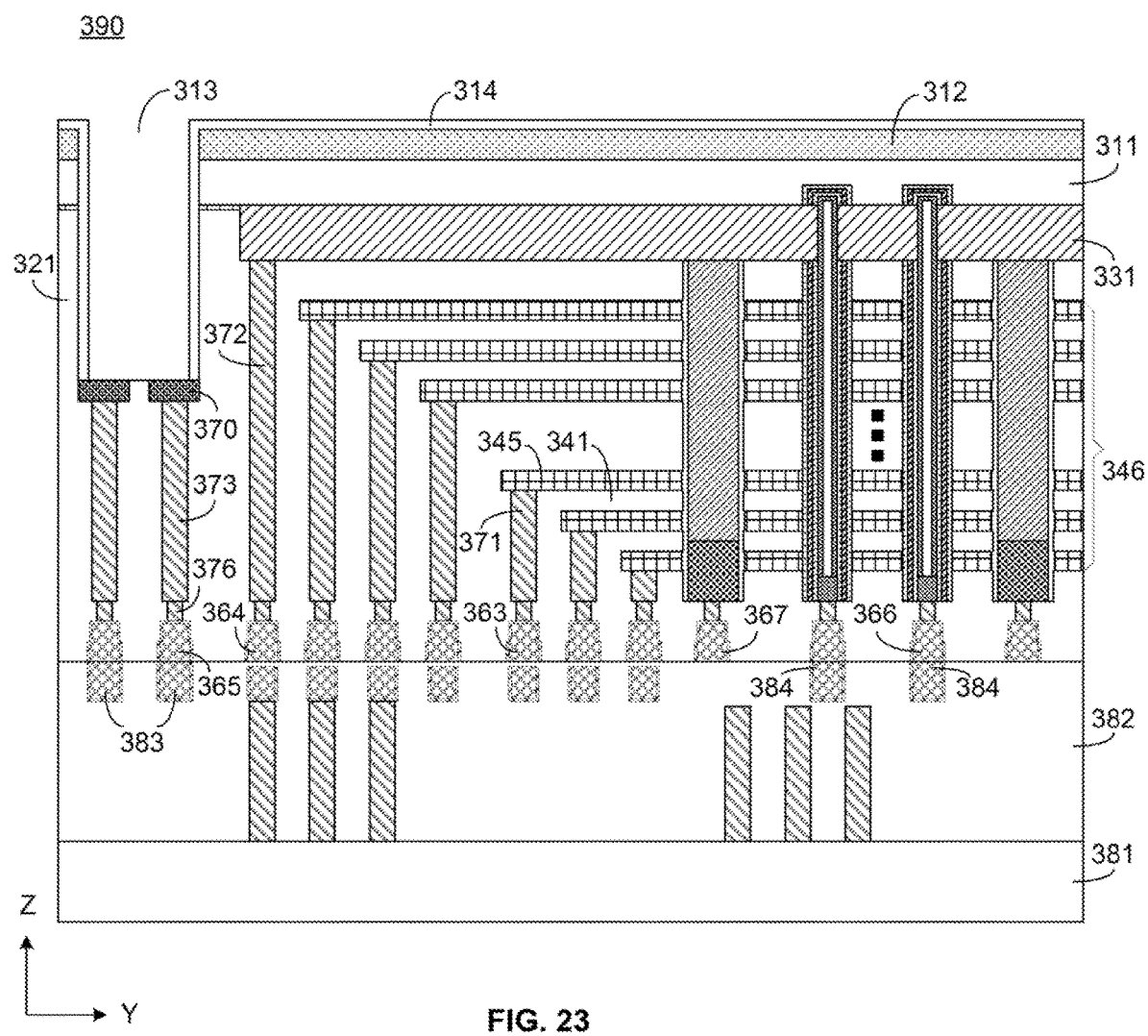
FIG. 23 illustrates a cross-sectional view of an exemplary 3D memory device after the 3D array device shown in FIG. 21 is bonded with the peripheral device shown in FIG. 22 according to various embodiments of the present disclosure.

FIG. 23 shows a schematic cross-sectional view of an exemplary 3D memory device 390 according to embodiments of the present disclosure. The cross-sectional view of FIG. 23 is in a Y-Z plane. The 3D memory device 390 is formed by bonding the 3D array device 300 and peripheral device 380 in a flip-chip bonding process. In some embodiments, the 3D array device 300 may be flipped vertically and become upside down with the top surfaces of the connecting pads 363-367 facing downward in the Z direction. The 3D array device 300 may be placed above and aligned with the peripheral device 380. For example, the connecting pads 365 and 366 may be aligned with the connecting pads 383 and 384, respectively. Then, the 3D array device 300 and peripheral device 380 may be joined and bonded together. The connecting pads 365-366 are electrically connected to the connecting pads 383-384, respectively.

Thereafter, the substrate 310 of the 3D array device 300 may be thinned and a dielectric layer 312 may be grown over the doped region 311 by a deposition process. An opening 313 may be formed by a dry etch process or a combination of dry etch and wet etch processes. The opening 313 penetrates through the dielectric layer 312, the doped region 311, and a part of the dielectric layer 321 to expose the metal layers 370. A dielectric layer 314 may be formed as a passivation layer on the dielectric layer 312 and the sidewall of the opening 313. A top passivation layer of the 3D memory device 390 may include a portion of the dielectric layer 314 that is over the dielectric layer 312.

The exposed metal layers 370, which are beside the staircase structure and the layer stack 346, may be used as contact pads for the 3D memory device 390. For example, bonding wires may be bonded on the metal layers 370 for connection with another device. As described above, the vertical position of the metal layers 370 may be any place between the doped region 311 and the via 376. In some embodiments, the contact pads (i.e., the metal layer 370) may be proximate to the top passivation layer. Alternatively, the contact pads (i.e., the metal layer 370) may be proximate to the connecting pads 365. Further, the contact pads (i.e., the metal layer 370) may also be around a middle region between the top passivation layer and the connecting pads 365.

The connecting pad 365, via 376, peripheral contact 373, and the contact pad (i.e., the metal layer 370) are disposed on top of one another and are electrically connected. Thus, the contact pad (i.e., the metal layer 370) is electrically connected to a corresponding connecting pad 383 of the peripheral device 380. The contact pads, peripheral contacts 373, vias 376, and connecting pads 365 are horizontally surrounded by the dielectric region 321 that extends vertically from the contact pads (i.e., the metal layer 370) to the connecting pads 365. The peripheral contact 373 and via 376 may be considered as an electrically conductive channel. The conductive channel is surrounded by the dielectric region 321 horizontally and extends towards the connecting pad 383 of the peripheral device 380 along a channel direction (e.g., the Z direction). Horizontally, the contact pads and the conductive channel are spaced apart from the layer stack 346 by certain distances respectively along a direction perpendicular to the channel direction (e.g., the Y direction). Vertically, the contact pads may be at a level matching one of the stack layers 341 (i.e., a first dielectric layer) or one of the conductor layers 345 with respect to the peripheral device 380.

Thereafter, other fabrication steps or processes may be performed to complete fabrication of the 3D memory device 390. Details of the other fabrication steps or processes are omitted for simplicity.

Since the contact pads (i.e., the metal layers 370) are formed before the flip-chip bonding process, the peripheral device 380 may experience fewer plasma processing steps after being bonded with the 3D array device 300. Hence, less PID may occur to the peripheral CMOS circuits. The effects of PID may be reduced and the yield and reliability of the 3D memory device 390 may be improved.

Figure 24:
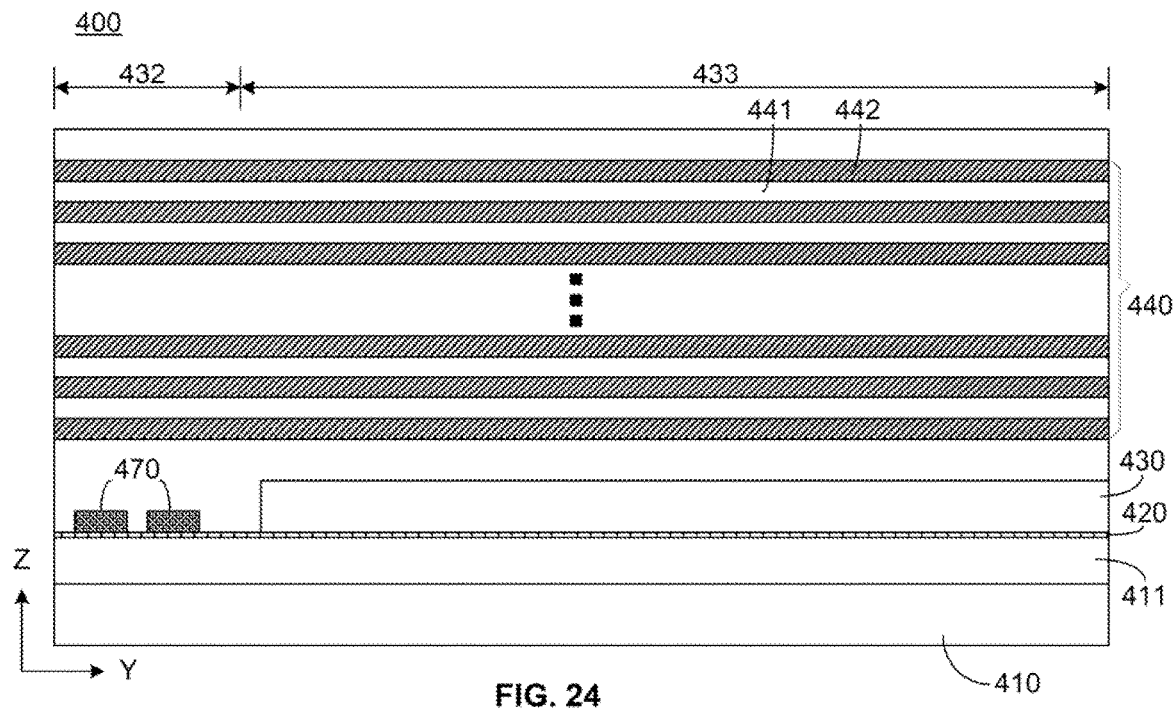
FIGS. 24 and 25 illustrate cross-sectional views of another exemplary 3D array device at certain stages during a fabrication process according to various embodiments of the present disclosure.
Figure 25:
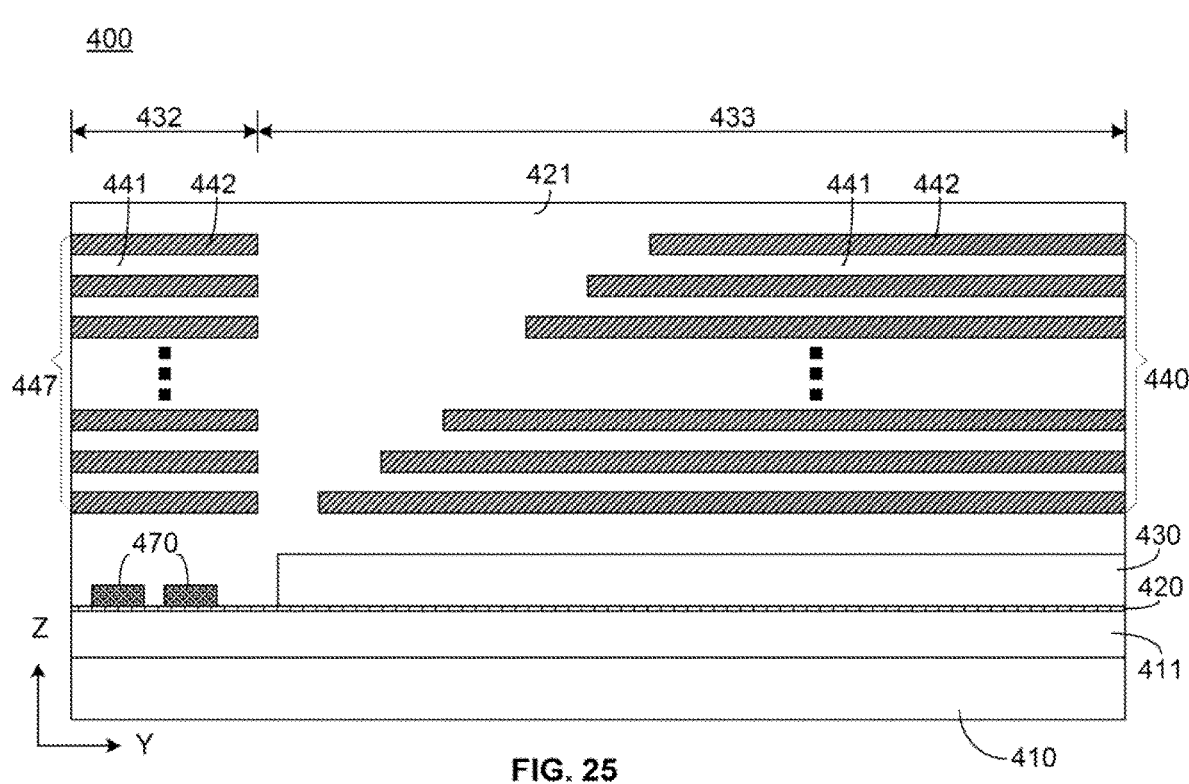
Figure 26:
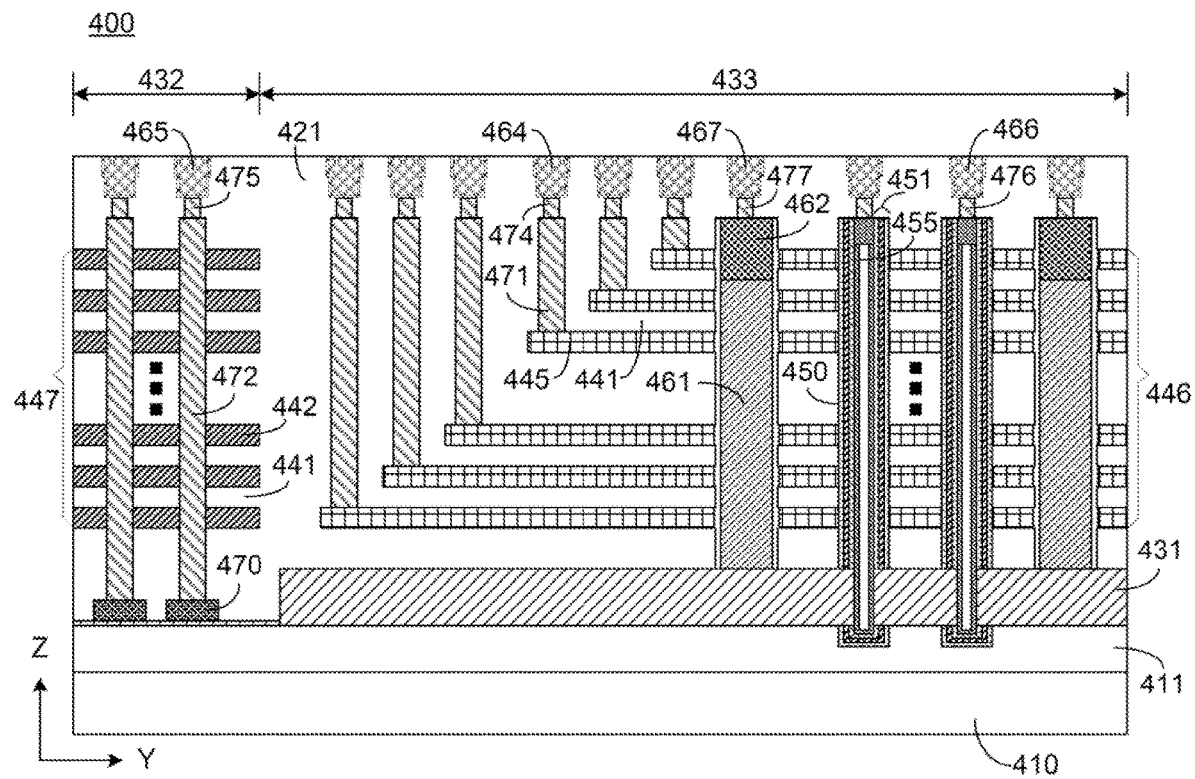
FIG. 26 illustrates a cross-sectional view of the 3D array device shown in FIG. 25 at a certain stage in the exemplary fabrication process according to various embodiments of the present disclosure.

FIGS. 24-26 schematically show a fabrication process of an exemplary 3D array device 400 according to embodiments of the present disclosure. The 3D array device 400 is a part of a memory device and may also be referred to as a 3D memory structure. Among FIGS. 24-26, the cross-sectional views are in a Y-Z plane. The 3D array device 400 may include a substrate 410. In the following descriptions, as an example, the substrate 410 includes an undoped or lightly doped single crystalline silicon layer.

In some embodiments, a top portion of the substrate 410 may be doped by n-type dopants to form a doped region 411. A cover layer 420 may be deposited over the doped region 411. The cover layer 420 is a sacrificial layer and may include a single layer or multiple layers. For example, the cover layer 420 may include one or more of silicon oxide layer, silicon nitride layer, and aluminum oxide layer. Then, a sacrificial layer 430 may be deposited over the cover layer 420. The sacrificial layer 430 may include a semiconductor material or dielectric material. In descriptions bellow, as an example, the sacrificial layer 430 is a polysilicon layer.

Further, a part of the sacrificial layer 430 in a contact region 432 may be etched by a dry etch process or a combination of dry and wet etch processes. The etch process exposes a portion of the cover layer 420. Further, metal layers 470 may be grown over the exposed portion of the cover layer 420 by CVD, PVD, ALD, electroplating, electroless plating, or any combination thereof.

Thereafter, the metal layers 470 may be covered by a dielectric material such as silicon oxide and a layer stack 440 may be deposited over the sacrificial layer 430 and the metal layers 470, as shown in FIG. 24. The layer stack 440 includes multiple pairs of stack layers 441 and 442, i.e., the stack layers 441 and 442 are stacked alternately.

In some embodiments, the stack layers 441 and 442 may include a first dielectric material and a second dielectric material that is different from the first dielectric material. As such, the stack layers 441 and 442 may become a first dielectric layer and a second dielectric layer, respectively. In descriptions bellow, exemplary materials for the stack layers 441 and 442 are silicon oxide and silicon nitride, respectively. The silicon oxide layer may be used as an isolation stack layer and the silicon nitride layer may be used as a sacrificial stack layer.

Further, a staircase formation process may be performed to trim a part of the layer stack 440 into a staircase structure in a channel hole region 433. The staircase structure may be covered by a dielectric material such as silicon oxide that forms a dielectric layer 421. During the staircase formation process, the stack layers 441 and 442 in the contact region 432 may remain unchanged that may form a layer stack 447, as shown in FIG. 25. Horizontally, the metal layers 470 and the layer stack 447 are in the contact region 432, beside the staircase structure, and spaced apart by certain distances from the staircase structure, respectively. Similarly, the metal layers 470 and the layer stack 447 are beside the layer stack 440, and spaced apart by certain distances from the layer stack 440, respectively. Besides, the staircase structure is between the layer stacks 446 and 447. In the vertical direction, the metal layers 470 are under the layer stack 447 or under the first and second dielectric layers 441 and 442 that are alternately stacked.

Similar to the metal layers 170 of the device 100, the metal layers 470 may also be deposited before or after forming the sacrificial layer 430 and before forming the layer stack 440. In the first method, the cover layer 420 may be formed over the substrate 410, the metal layers 470 may be deposited over the cover layer 420, and then the doped region 411, the sacrificial layer 430, and the layer stack 440 may be formed. In the second method, the doped region 411 may be created, the cover layer 420 may be formed over the doped region 411, and then the metal layers 470 may be deposited over the cover layer 420, followed by forming the sacrificial layer 430 and the layer stack 440. In the third method, the doped region 411 may be created, the cover layer 420 and the sacrificial layer 430 may be formed over the doped region 411, and then part of the sacrificial layer 430 may be etched to create an opening that exposes the cover layer 420. Then the metal layers 470 may be deposited in the opening over the cover layer 420, followed by the formation of the layer stack 440. In the fourth method, the doped region 411 may be created, the cover layer 420 and the sacrificial layer 430 may be formed over the doped region 411, and then the metal layers 470 may be deposited over the sacrificial layer 430, followed by the formation of the layer stack 440. In the above scenarios, the metal layers 470 may be buried under a portion of the layer stack 440, i.e., covered by the alternating first and second dielectric layers 441 and 442 after the formation of the layer stack 440.

After the staircase formation process, channel holes 450 may be formed through the layer stack 440. The quantity, dimension, and arrangement of the channel hole 450 are exemplary and for description of structures and fabrication methods of the 3D array device 400. The channel holes 450 may have a cylinder shape or pillar shape that extends through the layer stack 440, the sacrificial layer 430, and the cover layer 420, and partially penetrates the doped region 411. After the channel holes 450 are formed, a functional layer 451 may be deposited on the sidewall and bottom of the channel hole. The functional layer 451 may include a blocking layer on the sidewall and bottom of the channel hole, a charge trap layer on a surface of the blocking layer, and a tunnel insulation layer on a surface of the charge trap layer.

In some embodiments, the functional layer 451 may include the ONO structure, which is used in descriptions below. For example, a silicon oxide layer may be deposited on the sidewall of the channel hole 450 as the blocking layer. A silicon nitride layer may be deposited on the blocking layer as the charge trap layer. Another silicon oxide layer may be deposited on the charge trap layer as the tunnel insulation layer. On the tunnel insulation layer, a polysilicon layer may be deposited as a channel layer 455. Like the channel holes, the channel layer 455 may also extend through the layer stack 440 and into the doped region 411. The channel holes 450 may be filled by an oxide material after the channel layers 455 are formed. The channel hole 450 may be sealed by a plug that includes an electrically conductive material (e.g., metal W) and electrically contacts the channel layer 455.

Further, gate line slits (not shown) may be formed by a dry etch process or a combination of dry and wet etch processes. The gate line slits may extend through the layer stack 440 and reach or partially penetrate the sacrificial layer 430 in the Z direction. As such, at the bottom of the gate line slits, parts of the sacrificial layer 430 are exposed. Spacer layers (not shown) may be deposited on the sidewall and bottom of the gate line slit. Portions of the spacer layers at the bottom of the slits may be removed by etch to expose the sacrificial layer 430. The sacrificial layer 430 may be etched out. Removal of the sacrificial layer 430 creates a cavity and exposes the cover layer 420 and bottom portions of the blocking layers formed in the channel holes 450. Portions of the blocking layer, the charge trap layers, and the tunnel insulation layer are etched away, exposing bottom portions of the channel layer 455. The cover layer 420 may be removed when the bottom portions of the functional layer 451 are etched away or in an additional selective etch process, exposing a top surface of the doped region 411.

The cavity above the doped region 411 may be filled by a semiconductor material, e.g., polysilicon, to form a semiconductor layer 431. The semiconductor layer 431 may be deposited on surfaces of the exposed portions of the doped region 411 and the channel layer 455. Further, the sacrificial stack layers 442 may be removed by etch and replaced by conductor layers 445 that includes an electrically conductive material such as W. The layer stack 440 becomes a layer stack 446 after the conductor layers 445 are formed. As both the layer stack 446 and the layer stack 447 have the stack layers 441, the layer stacks 446 and 447 have a stack layer that contain the same dielectric material.

Each conductor layer 445 may be configured to electrically connect one or more rows of NAND memory cells along the Y direction or in the X-Y plane and is configured as a word line for the 3D array device 400. The channel layer 455 formed in the channel hole 450 may be configured to electrically connect a NAND string along the Z direction and configured as a bit line for the 3D array device 400. The gate line slits may be filled with a conductive material 461 (e.g., doped polysilicon) and a conductive plug 462 (e.g., metal W). In some embodiments, the filled gate line slits may become an array common source for the 3D array device 400.

Thereafter, openings for word line contacts 471 and peripheral contacts 472 may be formed. The openings are then filled with a conductive material (e.g., W, Co, Cu, Al, or any combination thereof) to form the contacts 471-472. The peripheral contacts 472 are beside the staircase and the layer stack 446 and surrounded by the layer stack 447 horizontally. In the vertical direction, the peripheral contacts 472 electrically contact the metal layers 470 and extend through the layer stack 447.

Further, a CVD or PVD process may be performed to deposit a dielectric material (e.g., silicon oxide or silicon nitride) on the 3D array device 400. The dielectric layer 421 becomes thicker and covers the contacts 471-472. Openings for vias 474-477 may be formed and subsequently filled with a conductive material such as W, Co, Cu, or Al. The vias 474 and 475 are electrically connected to the word line contacts 471 and the peripheral contacts 472, respectively. The vias 476 and 477 are electrically connected to the upper ends of the NAND strings and the plugs 462, respectively.

A dielectric material (e.g., silicon oxide or silicon nitride) may be deposited to bury the vias 474-477 and further make the dielectric layer 421 thicker. Openings may be made and then filled with W, Co, Cu, Al, or a combination thereof to form connecting pads 464, 465, 466, and 467. As shown in FIG. 26, the connecting pads 464-467 are electrically connected to the vias 474-477, respectively.

Figure 27:
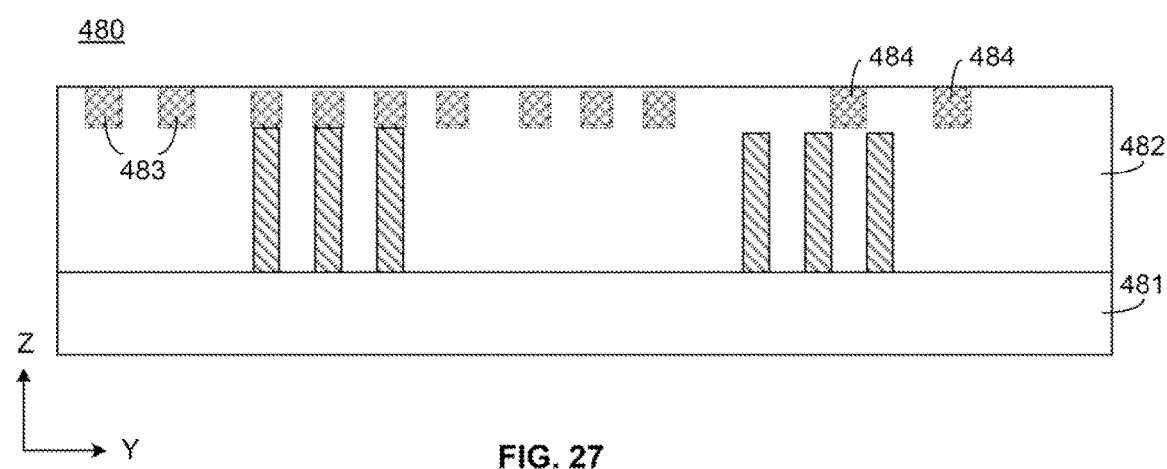
FIG. 27 illustrates a cross-sectional view of an exemplary peripheral device according to various embodiments of the present disclosure.

FIG. 27 schematically shows a peripheral device 480 in a cross-sectional view according to embodiments of the present disclosure. The peripheral device 480 is a part of a memory device. The peripheral device 480 may include a semiconductor substrate 481 (e.g., a substrate of single crystalline silicon). Peripheral CMOS circuits (e.g., CMOS control circuits) (not shown) may be fabricated on the substrate 481 and used for facilitating the operation of the memory device. A dielectric layer 482 including one or more dielectric materials may be deposited over the substrate 481 and the CMOS circuits. Connecting pads such as connecting pads 483 and 484 and vias may be formed in the dielectric layer 482. The connecting pads 483 and 484 are configured for interconnecting with the memory device and may include an electrically conductive material (e.g., W, Co, Cu, Al, or any combination thereof).

Figure 28:
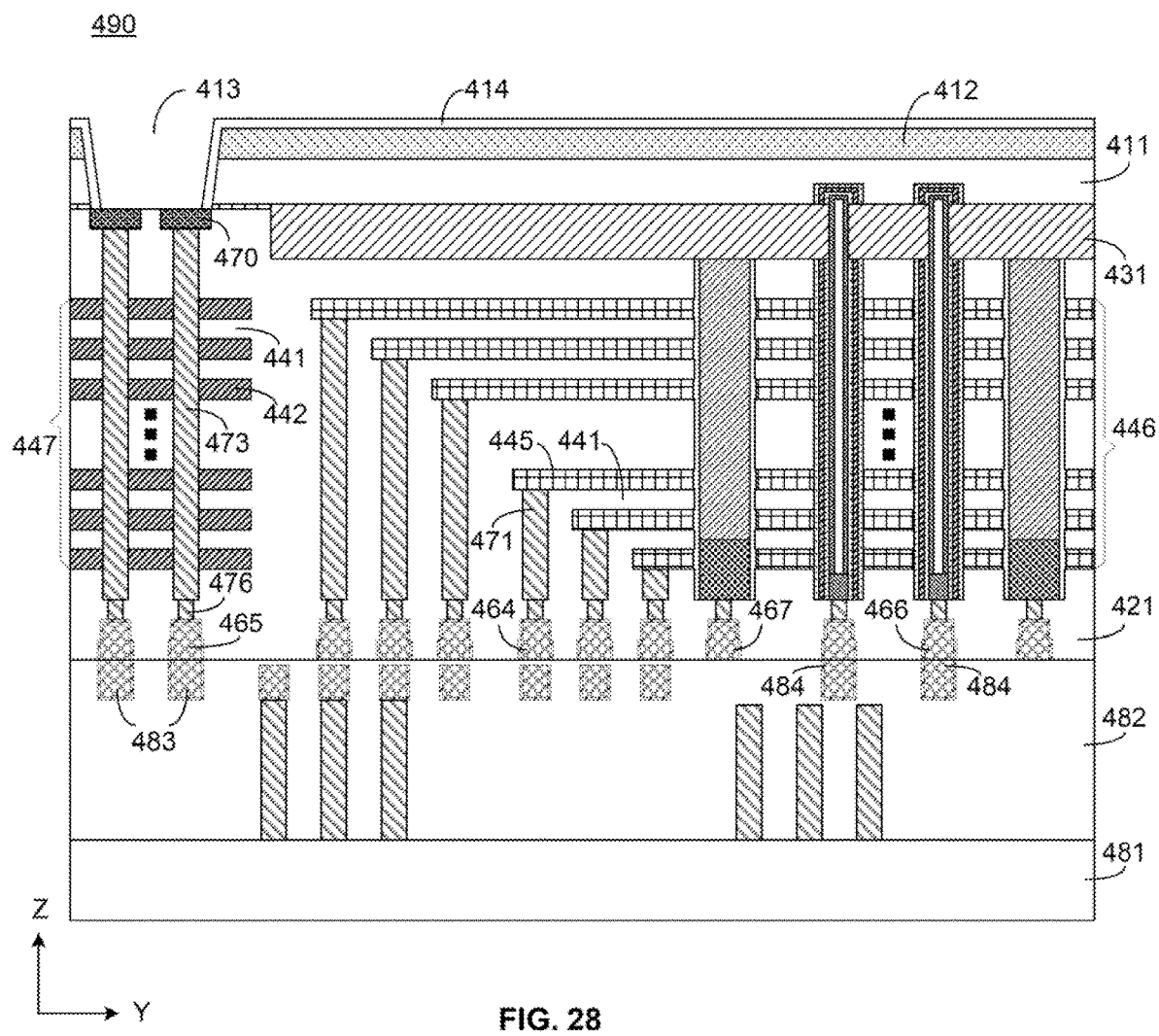
FIG. 28 illustrates a cross-sectional view of an exemplary 3D memory device after the 3D array device shown in FIG. 26 is bonded with the peripheral device shown in FIG. 27 according to various embodiments of the present disclosure.

FIG. 28 shows a schematic cross-sectional view of an exemplary 3D memory device 490 according to embodiments of the present disclosure. The cross-sectional view of FIG. 28 is in a Y-Z plane. As shown in FIG. 28, the 3D memory device 490 is formed by bonding the 3D array device 400 and peripheral device 480 in a flip-chip bonding process. In some embodiments, the 3D array device 400 may be flipped vertically and become upside down with the top surfaces of the connecting pads 464-467 facing downward in the Z direction. The 3D array device 400 may be placed above and aligned with the peripheral device 480. For example, the connecting pads 465 and 466 may be aligned with the connecting pads 483 and 484, respectively. Further, the 3D array device 400 and peripheral device 480 may be joined and bonded together. The connecting pads 465-466 may be electrically connected to the connecting pads 483-484, respectively. The layer stacks 446 and 447 and the peripheral CMOS circuits become sandwiched between the substrates 410 and 481 or between the doped region 411 and the substrate 481.

Thereafter, the substrate 410 of the 3D array device 400 may be thinned and a dielectric layer 412 may be grown over the doped region 411 by a deposition process. An opening 413 may be formed by a dry etch process or a combination of dry etch and wet etch processes. The opening 413 penetrates through the dielectric layer 412, the doped region 411, and the cover layer 420 to expose the metal layers 470. Next, a dielectric layer 414 may be formed as a passivation layer on the dielectric layer 412 and the sidewall of the opening 413.

The exposed metal layers 470, which are beside the staircase structure and the layer stack 446, may be used as contact pads for the 3D memory device 490. For example, bonding wires may be bonded on the metal layers 470 for connection with other devices. As described above, the connecting pad 465, via 476, peripheral contact 473, and the contact pad (i.e., the metal layer 470) are disposed on top of one another and are electrically connected. Thus, the contact pad (i.e., the metal layer 470) is electrically connected to a corresponding connecting pad 483 of the peripheral device 480. The peripheral contacts 473 each extend through the layer stack 447, and are disposed between the metal layers 470 and the connecting pads 465 in a vertical direction. The layer stack 447 is also disposed between the metal layers 470 and the connecting pads 465 in the vertical direction. The peripheral contact 473 and via 476 may be considered as an electrically conductive channel. The conductive channel runs through the layer stack 447 and extends from the metal layers 470 towards the connecting pad 483 of the peripheral device 480 along a channel direction (e.g., the Z direction). Horizontally, the layer stack 447 and the conductive channel are spaced apart from the layer stack 446 by certain distances respectively along a direction perpendicular to the channel direction (e.g., the Y direction).

Thereafter, other fabrication steps or processes may be performed to complete fabrication of the 3D memory device 490. Details of the other fabrication steps or processes are omitted for simplicity.

As the contact pads (i.e., the metal layers 470) are formed during the fabrication of the 3D array device 400, relatively fewer plasma processing steps may be performed after the flip-chip bonding process. Thus, relatively less PID may happen to the peripheral CMOS circuits. The yield and reliability of the 3D memory device 490 may be improved.

Although the principles and implementations of the present disclosure are described by using specific embodiments in the specification, the foregoing descriptions of the embodiments are only intended to help understand the present disclosure. In addition, features of aforementioned different embodiments may be combined to form additional embodiments. A person of ordinary skill in the art may make modifications to the specific implementations and application range according to the idea of the present disclosure. Hence, the content of the specification should not be construed as a limitation to the present disclosure.

What is claimed is:

1. A method for fabricating a three-dimensional (3D) memory device, comprising:
   providing a substrate for the 3D memory device;
   forming at least one contact pad over a first portion of a first surface of the substrate;
   forming a plurality of memory cells of the 3D memory device over a second portion of the first surface of the substrate;
   depositing a first dielectric layer to cover the at least one contact pad and the plurality of memory cells of the 3D memory device;
   forming a plurality of first connecting pads over the first dielectric layer and connected to the at least one contact pad and the plurality of memory cells of the 3D memory device;
   bonding the plurality of first connecting pads with a plurality of second connecting pads of a peripheral structure; and
   exposing the at least one contact pad from a second surface, opposite to the first surface, of the substrate, wherein the exposed at least one contact pad and the peripheral structure are on opposite sides of the plurality of memory cells along a vertical direction with respect to the substrate, wherein exposing the at least one contact pad includes:
   forming an opening through the substrate and the second dielectric layer to expose the at least one contact pad.

2. The method according to claim 1, wherein forming the plurality of memory cells of the 3D memory device includes:
   forming a first layer stack including a plurality of first dielectric stack layers and a plurality of conductive stack layers alternately stacked over each other; and
   forming the plurality of memory cells through the first layer stack.

3. The method according to claim 2, wherein:
   the at least one contact pad is formed before forming the first layer stack and before bonding the 3D memory device with a peripheral structure.

4. The method according to claim 2, wherein forming the plurality of memory cells through the first layer stack includes:
  forming a plurality of channel structures extending through the first layer stack, wherein each of the channel structures comprises a functional layer and a channel layer, the functional layer being between the channel layer and the first layer stack.

5. The method according to claim 4, wherein forming the plurality of memory cells through the first layer stack further includes:
  before forming the first layer stack, forming a semiconductor layer, the plurality of channel structures each extending into the semiconductor layer and the semiconductor layer being between the substrate and the first layer stack.

6. The method according to claim 5, wherein:
  the semiconductor layer comprises one or more doped layers.

7. The method according to claim 2, wherein:
  the at least one contact pad is formed after a second dielectric layer is deposited over the substrate and before forming the first layer stack.

8. The method according to claim 2, wherein:
  the at least one contact pad is formed after forming the first layer stack and before forming the plurality of memory cells through the first layer stack.

9. The method according to claim 2, wherein:
  the at least one contact pad is formed after trimming a portion of the first layer stack to form a staircase structure and before forming the plurality of memory cells through the first layer stack.

10. The method according to claim 1, further comprising:
  thinning or removing the substrate before forming the opening to expose the at least one contact pad.

11. The method according to claim 2, further comprising:
  forming a second layer stack before forming the plurality of first connecting pads, the second layer stack disposed between the plurality of first connecting pads and the at least one contact pad and including a plurality of second dielectric stack layers and a plurality of third dielectric stack layers alternately stacked over each other.

12. A three-dimensional (3D) memory device, comprising:
  an array device and a peripheral device bonded at a first surface of the array device, the array device including an insulating layer, one or more contact pads, and a plurality of memory cells; and
  an opening formed through a first portion of the insulating layer and exposing the one or more contact pads disposed at a bottom of the opening from a second surface, opposite to the first surface, of the array device, the plurality of memory cells disposed between a second portion of the insulating layer and the peripheral device, wherein the first portion and the second portion of the insulating layer are arranged along a lateral direction with respect to a surface of the insulating layer.

13. The 3D memory device according to claim 12, further comprising:
  one or more conductive contacts between the first portion of the insulating layer and the peripheral device and connecting the one or more contact pads to one or more first connecting pads, the one or more first connecting pads bonded with one or more second connecting pads of the peripheral device.

14. The 3D memory device according to claim 12, further comprising:
  a first layer stack including a plurality of first dielectric stack layers and a plurality of conductive stack layers alternately stacked over each other, wherein the plurality of memory cells comprise a plurality of channel structures and the plurality of conductive stack layers, each of the channel structures extending through the plurality of conductive stack layers.

15. The 3D memory device according to claim 13, further comprising:
  a second layer stack disposed between the first portion of the insulating layer and the peripheral device and surrounding the one or more conductive contacts.

16. The 3D memory device according to claim 15, wherein:
  the second layer stack includes a plurality of second dielectric stack layers and a plurality of third dielectric stack layers alternately stacked over each other.

17. The 3D memory device according to claim 14, further comprising:
  a semiconductor layer disposed between the insulating layer and the first layer stack, the plurality of channel structures each extending into the semiconductor layer.

18. The 3D memory device according to claim 12, wherein:
  the one or more contact pads are disposed below a level of the insulating layer with respect to the peripheral device.

19. The 3D memory device according to claim 17, wherein:
  a bottom surface of the opening is at a level of the semiconductor layer or below a level of the semiconductor layer with respect to the peripheral device.

* * * * *